(12) United States Patent
Cone et al.

(10) Patent No.: US 11,262,651 B2
(45) Date of Patent: Mar. 1, 2022

(54) SYSTEM FOR DETECTING ACCUMULATED MATERIAL ON A FACEPLATE OF A DISPENSER AND METHOD OF INSPECTING THE FACEPLATE

(71) Applicant: CANON KABUSHIKI KAISHA, Tokyo (JP)

(72) Inventors: Craig William Cone, Austin, TX (US); Steven C. Shackleton, Austin, TX (US); Brent Andrew Snyder, Austin, TX (US); James W. Irving, Austin, TX (US); Brandyn L. Kinsey, Pflugerville, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/886,102

(22) Filed: May 28, 2020

(65) Prior Publication Data
US 2021/0373437 A1   Dec. 2, 2021

(51) Int. Cl.
*G03F 7/00*  (2006.01)
*G03F 7/16*  (2006.01)

(52) U.S. Cl.
CPC ............. *G03F 7/0002* (2013.01); *G03F 7/16* (2013.01)

(58) Field of Classification Search
None
See application file for complete search history.

(56) References Cited

U.S. PATENT DOCUMENTS

| | | |
|---|---|---|
| 4,241,357 A | 12/1980 | Anestos |
| 6,936,194 B2 | 8/2005 | Watts |
| 7,157,036 B2 | 1/2007 | Choi |
| 8,015,939 B2 | 9/2011 | Dijksman |
| 8,066,930 B2 | 11/2011 | Sreenivasan |
| 8,076,386 B2 | 12/2011 | Xu |
| 8,349,241 B2 | 1/2013 | Sreenivasan |
| 8,922,501 B2 | 12/2014 | Wu |
| 9,030,439 B2 | 5/2015 | Chang |
| 2014/0111576 A1* | 4/2014 | Vodopivec ........... B41J 2/16552 347/30 |
| 2014/0125361 A1 | 5/2014 | Tevs |
| 2014/0218056 A1 | 8/2014 | Alatas |
| 2015/0174816 A1* | 6/2015 | Mizuno ................. B29C 59/002 264/101 |

* cited by examiner

*Primary Examiner* — Alexander M Weddle
(74) *Attorney, Agent, or Firm* — Canon U.S.A., Inc., IP Division

(57) ABSTRACT

A method of inspecting a dispenser including a faceplate comprises translating a sensor across the faceplate while measuring a distance between the sensor and the faceplate. The sensor is oriented such that a longitudinal axis of the sensor extends at an acute angle relative to a longitudinal axis of the faceplate. The method may include translating another sensor across the faceplate while measuring the same distance. Or the method may include another translating of the sensor across the faceplate while measuring the same distance. In either case, the sensor is oriented such that the longitudinal axis of the sensor extends at an obtuse angle relative to the longitudinal axis of the faceplate. The method includes determining, based on the measured distances, whether an amount of accumulated formable material on the surface of the faceplate is greater than a predetermined value.

21 Claims, 15 Drawing Sheets

SYSTEM FOR DETECTING ACCUMULATED MATERIAL ON A FACEPLATE OF A DISPENSER AND METHOD OF INSPECTING THE FACEPLATE

BACKGROUND

Field of Art

The present disclosure relates to a system for inspecting a faceplate of a dispenser and a method of inspecting the faceplate.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

The nano-fabrication technique involves dispensing the formable material from a dispenser onto the substrate. Over many dispensing cycles, the formable material may accumulate on a faceplate of the dispenser. Eventually, the amount of accumulation can interfere with the production and needs to be cleaned. Determining whether it is necessary to clean the faceplate can take time and interrupt production depending on the particular method of inspection, for example manual visual inspection. One alternative to inspecting the faceplate is to clean the faceplate regardless of inspecting the accumulation amount after a predetermined amount of time or a predetermined number of dispensing operations. However, either case interrupts production, often unnecessarily. Therefore, it is desirable for method of detecting accumulation on the faceplate that reduces the impact on production.

SUMMARY

A method of inspecting a dispenser including a faceplate, the faceplate having a first end, a second end, a surface, a length extending from the first end to the second end, and a longitudinal axis along the length, the method comprising translating a sensor across the length of the faceplate while measuring a distance between the sensor and the faceplate, wherein the sensor is oriented such that a longitudinal axis of the sensor extends at an acute angle relative to the longitudinal axis of the faceplate, a step selected from the group consisting of: a) translating another sensor across the length of the faceplate while measuring a distance between the other sensor and the faceplate, wherein the other sensor is oriented such that a longitudinal axis of the other sensor extends at an obtuse angle relative to the longitudinal axis of the faceplate, and b) another translating of the sensor across the length of the faceplate while measuring the distance between the sensor and the faceplate, wherein the sensor is oriented such that the longitudinal axis of the sensor extends at an obtuse angle relative to the longitudinal axis of the faceplate, determining, based on the measured distances, whether an amount of accumulated formable material on the surface of the faceplate is greater than a predetermined value.

A dispensing system for inspecting a dispenser including a faceplate, the faceplate having: a first end, a second end, a surface, a length extending from the first end to the second end, and a longitudinal axis along the length. The system comprises at least one sensor; one or more processors, and one or more memories storing instructions, when executed by the one or more processors, for: translating a sensor of the at least one sensor across the length of the faceplate while measuring a distance between the sensor and the faceplate, wherein the sensor is oriented such that a longitudinal axis of the sensor extends at an acute angle relative to the longitudinal axis of the faceplate, performing a step selected from the group consisting of: a) translating another sensor of the at least one sensor across the length of the faceplate while measuring a distance between the other sensor and the faceplate, wherein the other sensor is oriented such that a longitudinal axis of the other sensor extends at an obtuse angle relative to the longitudinal axis of the faceplate, and b) another translating of the sensor across the length of the faceplate while measuring the distance between the sensor and the faceplate, wherein the sensor is oriented such that the longitudinal axis of the sensor extends at an obtuse angle relative to the longitudinal axis of the faceplate, and determining, based on the measured distances, whether an amount of accumulated formable material on the surface of the faceplate is greater than a predetermined value.

A method of making an article, comprises cleaning a dispenser including a faceplate, the faceplate having a first end, a second end, a surface, a length extending from the first end to the second end, and a longitudinal axis along the length, the cleaning including: translating a sensor across the length of the faceplate while measuring a distance between the sensor and the faceplate, wherein the sensor is oriented such that a longitudinal axis of the sensor extends at an acute angle relative to the longitudinal axis of the faceplate, a step selected from the group consisting of: a) translating another sensor across the length of the faceplate while measuring a distance between the other sensor and the faceplate, wherein the other sensor is oriented such that a longitudinal axis of the other sensor extends at an obtuse angle relative to the longitudinal axis of the faceplate, and b) another translating of the sensor across the length of the faceplate while measuring the distance between the sensor and the faceplate, wherein the sensor is oriented such that the longitudinal axis of the sensor extends at an obtuse angle relative to the longitudinal axis of the faceplate, determining, based on the measured distances, whether an amount of accumulated formable material on the surface of the faceplate is greater than a predetermined value, and in a case that the amount of accumulated formable material is determined to be greater than a predetermined value, cleaning the surface of the faceplate, dispensing a portion of the formable material onto a substrate using the dispenser, forming a pattern or a layer of the dispensed formable material on the substrate, and processing the formed pattern or layer to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1:
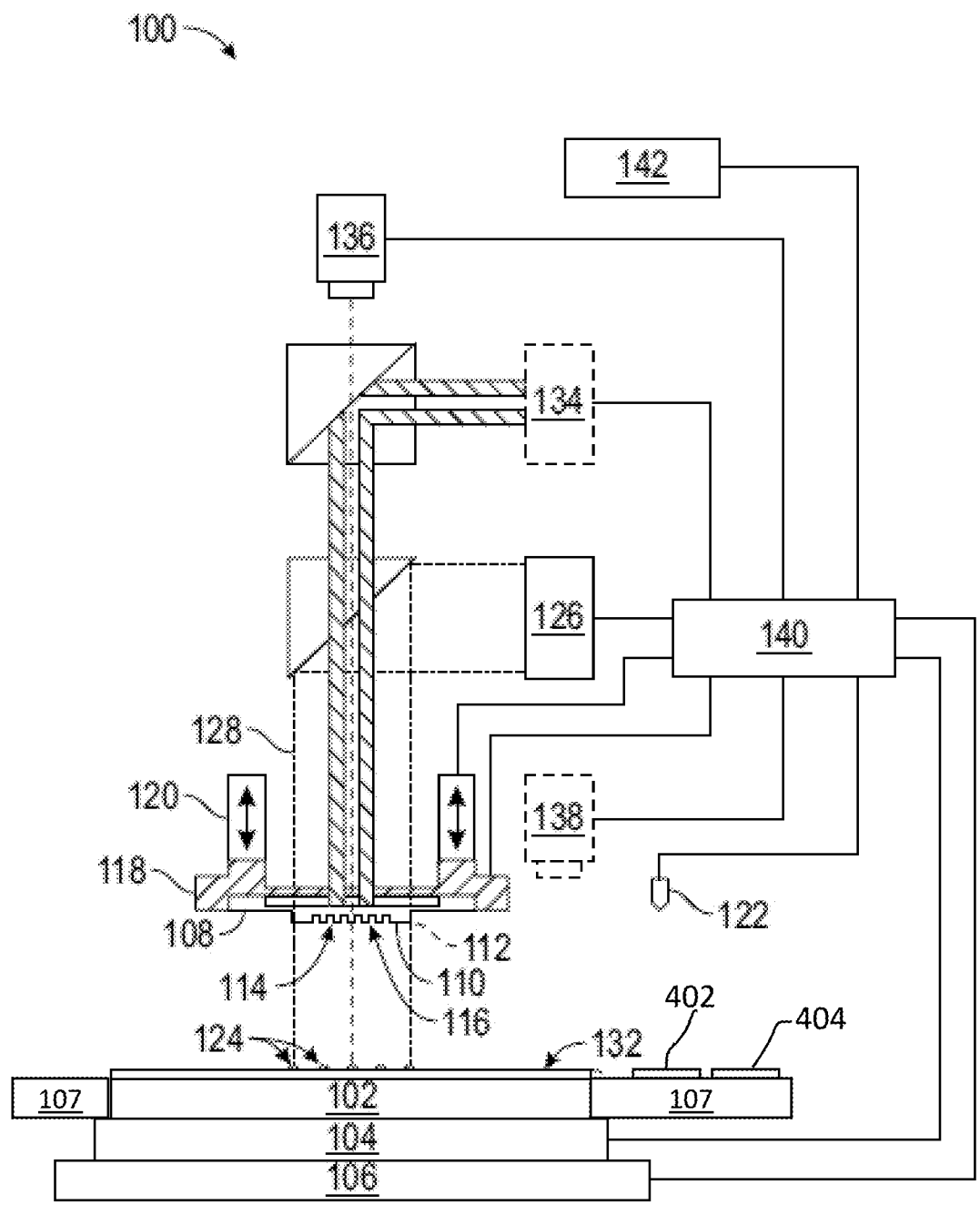
FIG. 1 is an illustration of an exemplary nanoimprint lithography system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

As noted above, the nano-fabrication technique involves dispensing the formable material from a dispenser onto the substrate. Over many dispensing cycles, the formable material may accumulate on a faceplate of the dispenser. Eventually, the amount of accumulation can interfere with the production and needs to be cleaned. It desirable for a cleaning system and method that does not require physical contact with the faceplate and minimizes interruption in production.

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc, which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
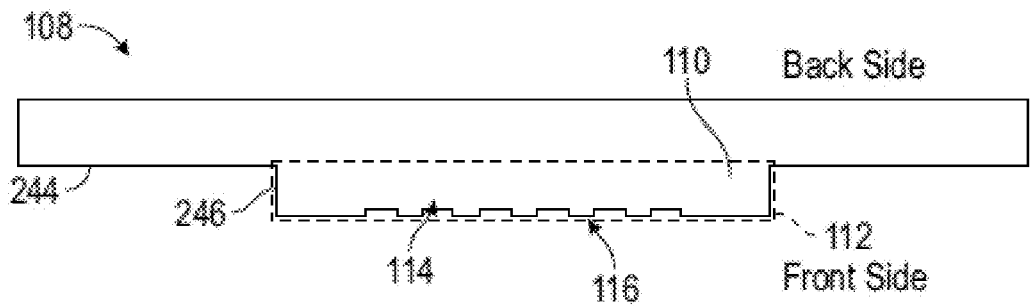
FIG. 2 is an illustration of an exemplary template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative template may be used in another embodiment, referred herein as a superstrate. In the case of the superstrate, the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
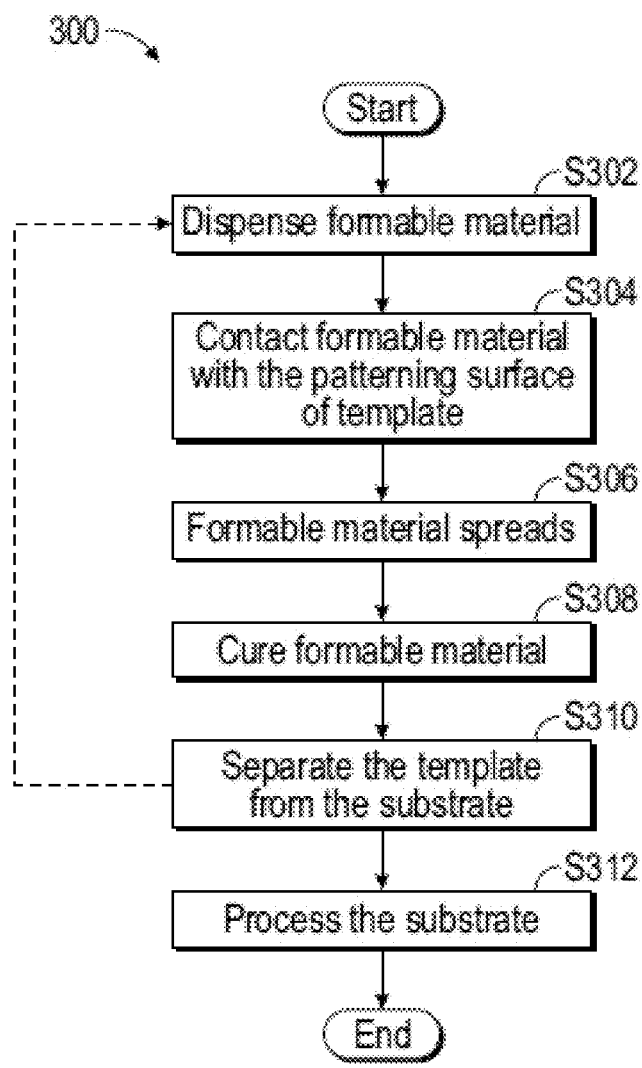
FIG. 3 is a flowchart illustrating an exemplary imprinting method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Drop Dispensing Method

A drop dispensing method by the nanoimprint lithography system 100 or planarization system can be used to dispense a pattern of drops of formable material 124 onto the substrate 102, which is then imprinted/planarized. Imprinting/planarizing may be done in a field by field basis or on a whole wafer basis. The drops of formable material 124 may also be deposited in a field by field basis or on a whole substrate basis. Even when the drops are deposited on a whole substrate basis generating the drop pattern is preferably done on a field by field basis.

Generating a drop pattern for a full field may include a processor 140 receiving a substrate pattern of a representative substrate 102, and a template pattern of a representative template 108.

The substrate pattern may include information about substrate topography of the representative substrate, a field of the representative substrate and/or a full field of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape of an edge such as a beveled edge or a rounded edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed.

The template pattern may include information about the topography of the patterning surface 112 of the representative template. The topography of the patterning surface 112 may be measured and/or generated based on design data. In an alternative embodiment, the template pattern of the representative embodiment is featureless and may be used to planarize the substrate 102. The patterning surface 112 may be the same size as: an individual full field; multiple fields; the entire substrate, or larger than the substrate.

Once the substrate pattern and the template pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material; material properties of the patterning surface; material properties of the substrate surface; spatial variation in volume between the patterning surface and the substrate surface; fluid flow; evaporation; etc.

Accumulation Detection System and Method

Figure 4A:
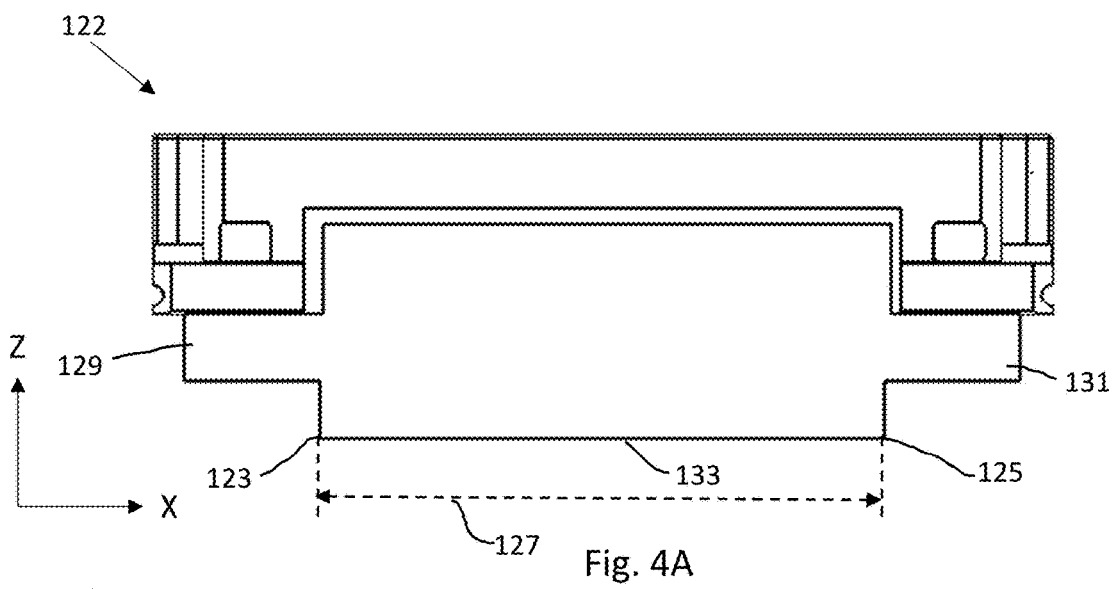
FIG. 4A shows a side view of a dispenser in accordance with an example embodiment.
Figure 4B:
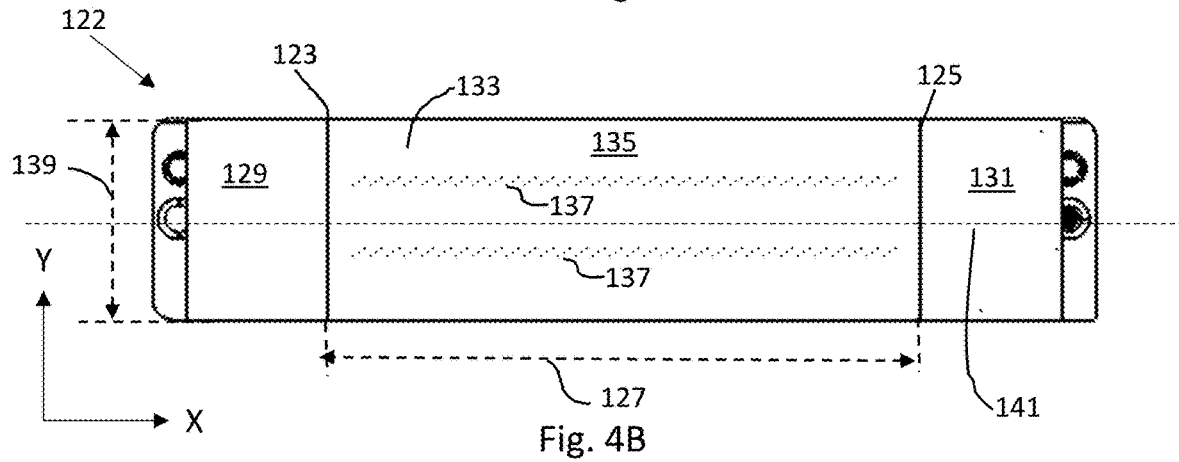
FIG. 4B shows an underside view of the dispenser of FIG. 4A in accordance with an example embodiment.
Figure 4C:
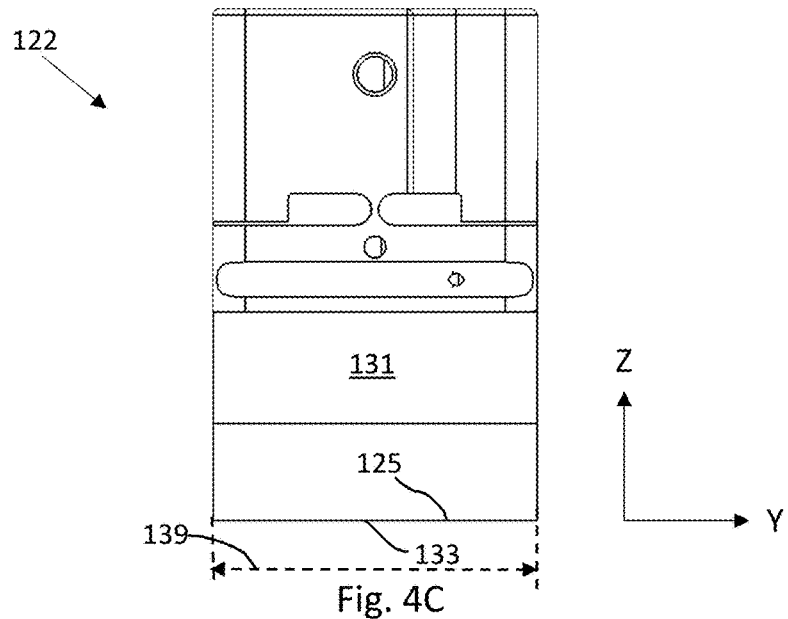
FIG. 4C shows an end view of the dispenser of FIG. 4A in accordance with an example embodiment.

FIG. 4A shows a side view of the dispenser 122. FIG. 4B shows an underside view of the dispenser 122. FIG. 4C shows an end view of the dispenser 122. The dispenser 122 includes a faceplate 133 having a surface 135 in which a plurality of dispensing nozzles 137 are formed. The number of nozzles 137 formed in the surface 135 of the faceplate 133 may be on the order of hundreds, for example 500 or more. The faceplate 133 includes a first end 123 and a second end 125. The faceplate 133 has a length 127 extending in an X dimension from the first end 123 to the second 125. The dispenser 122 has a first flange 129 extending from the first end 123 and a second flange 131 extending from the second end 125. The faceplate 133 includes a width 139 extending in a Y dimension, the Y dimension being perpendicular to the X dimension.

Figure 5A:
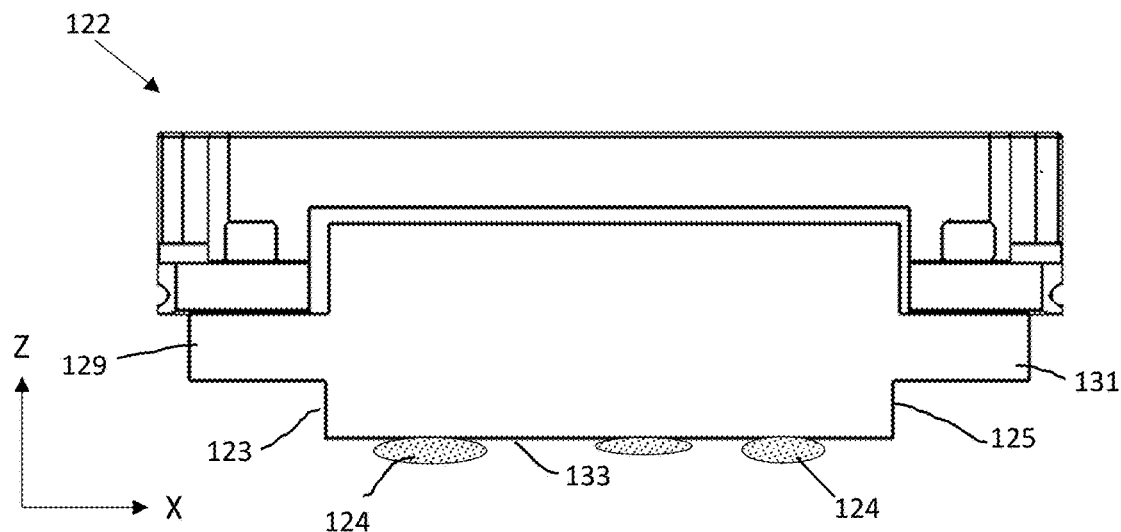
FIG. 5A shows a side view of the dispenser after formable material has accumulated on the surface of a faceplate, in accordance with an example embodiment.
Figure 5B:
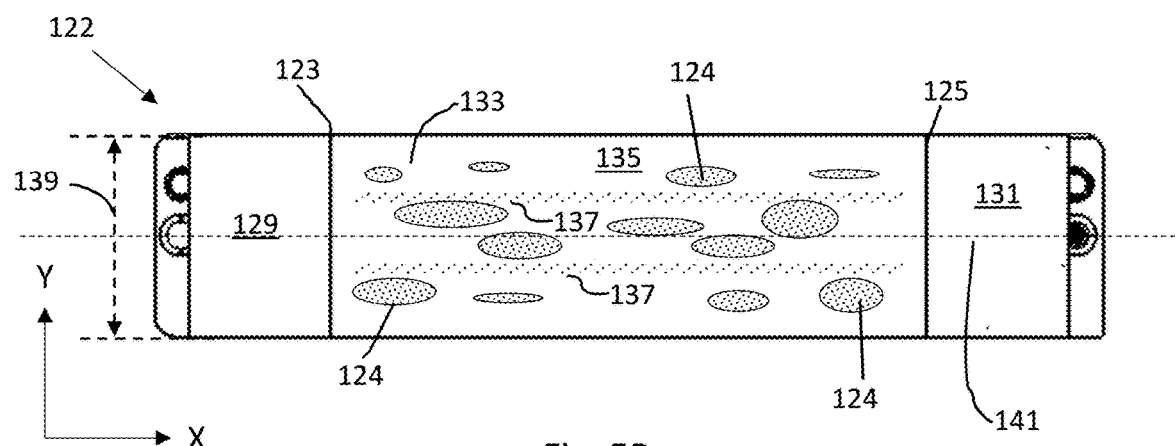
FIG. 5B shows a bottom view of the dispenser of FIG. 5A after formable material has accumulated on the surface of the faceplate, in accordance with an example embodiment.

FIGS. 5A and 5B show views of the dispenser 122 after formable material 124 has accumulated on the surface 135 of the faceplate 133. As shown schematically in FIGS. 5A and 5B the accumulated formable material 124 may be located at various patterns and thickness across the surface 135 of the faceplate 133. The system and method described herein is used to detect the accumulation on the faceplate 133.

Figure 6A:
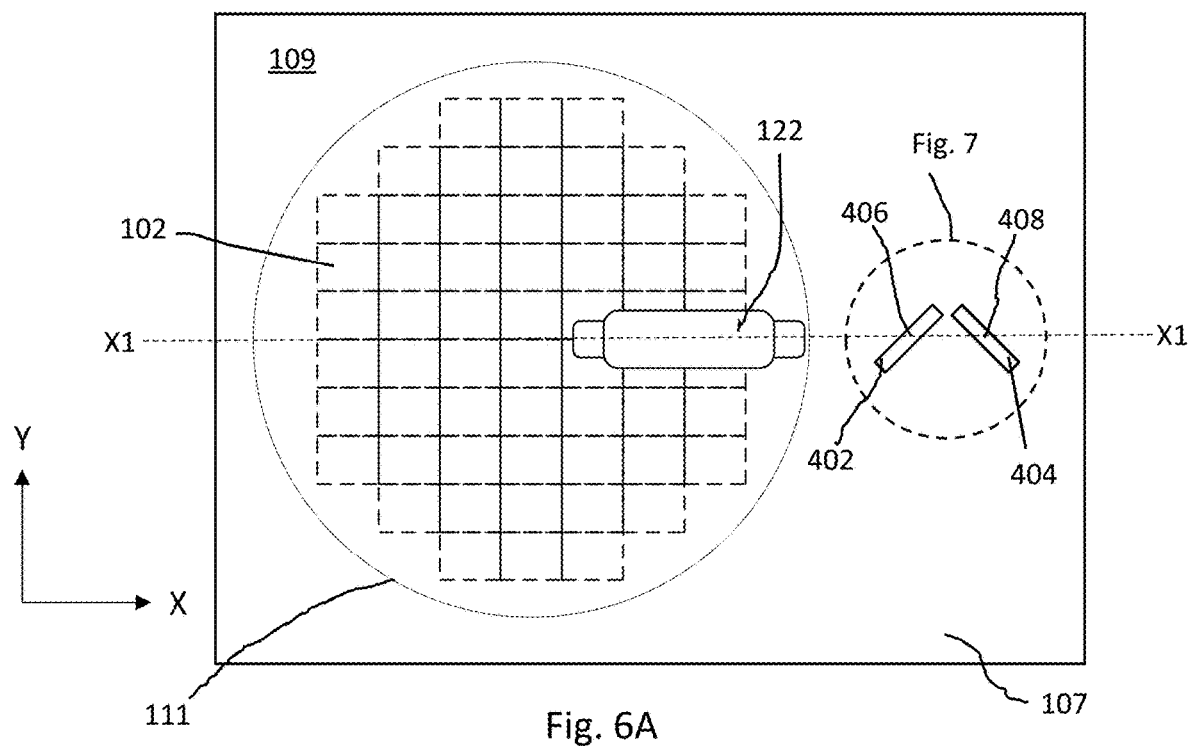
FIG. 6A shows a top view of an applique with the dispenser overhead a substrate in accordance with a first example embodiment
Figure 6B:
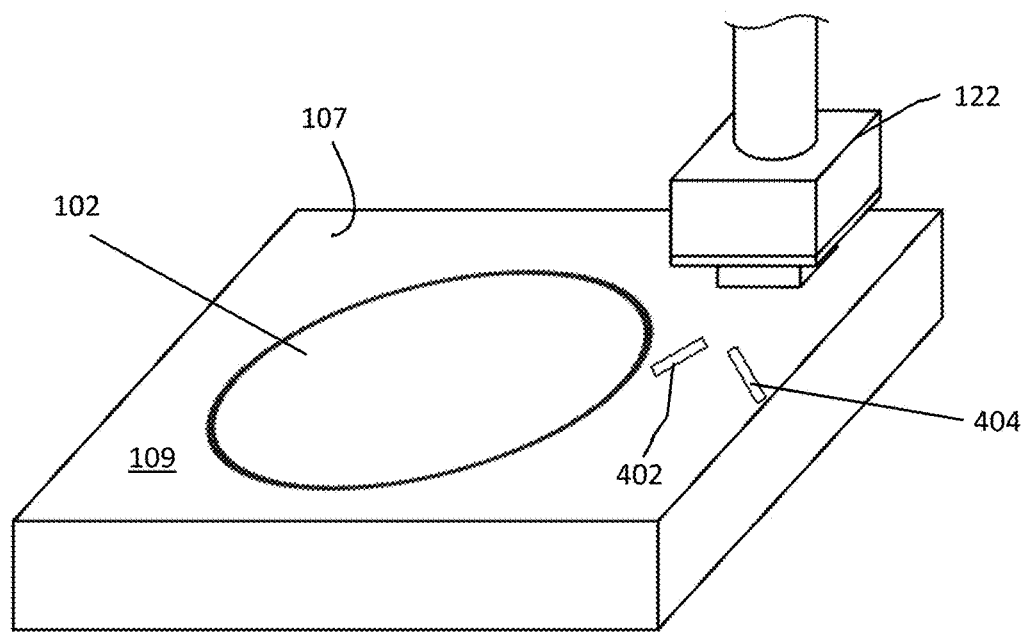
FIG. 6B shows a perspective view of the applique of FIG. 6A with the dispenser overhead the applique in accordance with the first example embodiment

FIG. 6A shows a top view of the applique 107 with the dispenser 122 overhead the substrate 102 in accordance with a first example embodiment. FIG. 6B shows a perspective view of the applique 107 of FIG. 6A with the dispenser 122 overhead the applique 107. As shown in FIGS. 6A and 6B, in the first example embodiment, a first sensor 402 and a second sensor 404 may be disposed on the applique 107. More particularly, the first sensor 402 and the second sensor 404 may disposed on an upper surface 109 of the applique 107. The applique 107 surrounds the substrate 102. That is, the applique 107 includes a cavity 111, to contain the substrate 102. The applique 107, along with the substrate 102, may be carried by the stage 106. The stage 106 may carry the applique 107 and substrate 102 underneath the dispenser 122 along the X dimension, i.e., along the length 127 of the faceplate 133. Alternatively, in another example embodiment, the applique 107 and the substrate 102 may be stationary, and the dispenser 122 can travel along the X dimension.

As shown in FIGS. 6A and 6B, the first sensor 402 and the second sensor 404 may be positioned on the surface 109 of the applique 107 so that the first sensor 402 and the second sensor 404 will pass underneath the surface 135 of the faceplate 133 upon controlled movement of the applique 107 relative to the dispenser 122. While FIGS. 6A and 6B show the first sensor 402 and the second sensor 404 adjacent to the right side of the substrate 102, the first sensor 402 and the second sensor 404 may be disposed anywhere on the surface 109 of the applique 107, preferably with the first sensor 402 and the second sensor 404 being angled and positioned relative to each other in the manner described below. For example, in another example embodiment, the first sensor 402 and the second sensor 404 may be located in the upper or lower corners of the applique 107. However, in another embodiment the sensors need not be angled or positioned relative to each other, which is described below.

The first sensor 402 and the second sensor 404 may each be a capacitive sensor. Capacitive sensors are known the art as non-contact devices capable of high-resolution measurement of the distance between the sensor and a target. In short, because the area of the sensor and target remain constant, and the dielectric of the material in the gap (i.e., air) also remains constant, any change in capacitance is a result of a change in the distance between the sensor and the target. Thus, as understood by those having ordinary skill in the art, the capacitance measured by a capacitive sensor can be correlated to distance between the target and the sensor. That is, the capacitive sensor outputs the distance between the target and the sensor. An example capacitive sensor that may be used for the first sensor 402 and the second sensor 404 may be a Micro-Epsilon America (Raleigh, N.C.) model capaNCDT 6139 with a customized rectangular active measuring area and with a high aspect ratio.

The first sensor 402 and the second sensor 404 may each have a high aspect ratio such that the length of the sensor is several times greater than the width of the sensor. For example, the aspect ratio (i.e., the ratio of the length to the width) may be from 50:1 to 5:1, from 40:1 to 10:1, from 30:1 to 15:1, or from 25:1 to 20:1. In an example embodiment the aspect ratio may be 30:1. The high aspect ratio allows for sufficient data collection to accurately determine the degree of accumulated formable material on the faceplate. An aspect ratio that is too low will not have sufficient lateral resolution to determine accumulation states for the dispenser. The length of the sensors may be selected such that the sensor spans the entire width 139 of the faceplate 133, when the sensors are angled. The angle of the sensors is discussed below with respect to FIG. 7. Because of the angle, the length of the sensor will be greater than (or equal to) the width 139 of the faceplate 133 so that the sensor spans the entire width 139 of the faceplate. In the example embodiment shown in FIGS. 6A to 7 the first sensor 402 and the second sensor 402 have the same aspect ratio and the same dimensions. While having the same size sensors provides the most accurate data, there may be some variation as long as the resulting data provided by the sensors allows the operator to accurately determine the degree of accumulation of the formable material on the faceplate.

Figure 7:
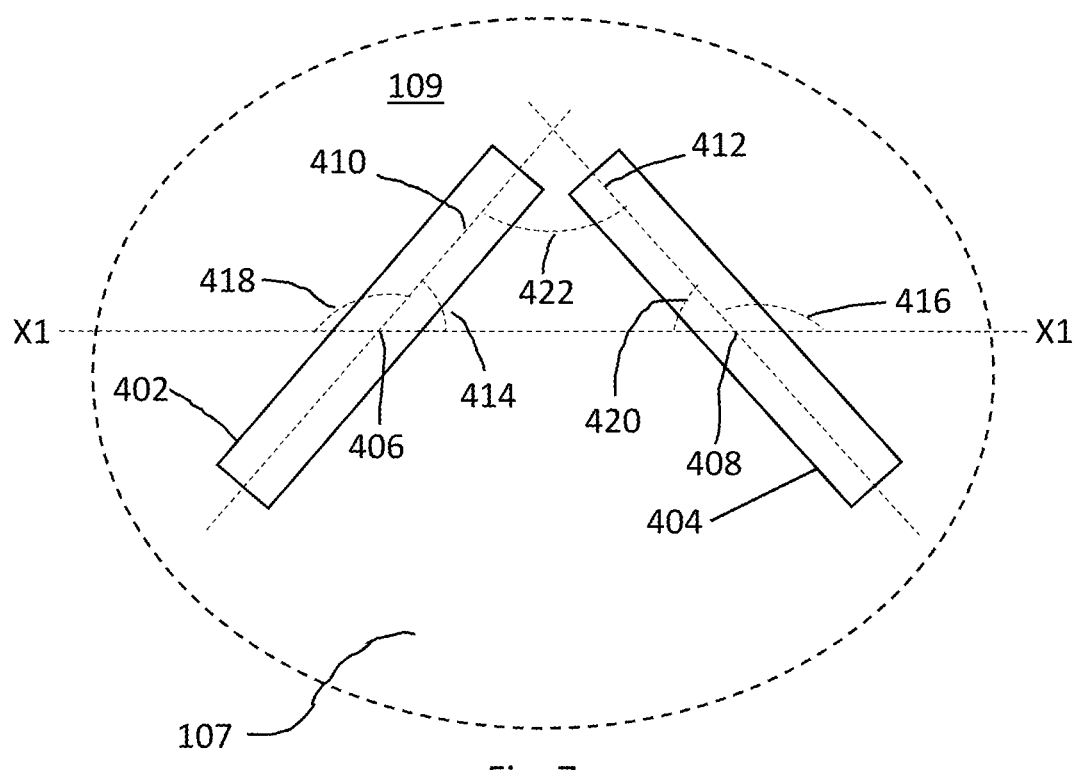
FIG. 7 shows a close up view of a portion of the applique having a first sensor and a second sensor on the surface in accordance with the first example embodiment

As stated above, the first sensor 402 and second sensor 404 are angled relative to each other. FIG. 7 shows a close up view of a portion of the applique 107 having the first sensor 402 and the second sensor 404 on the surface 109. As seen in FIG. 7, the first sensor 402 and the second sensor 404 are angled with respect to each other, which can be defined by a horizontal line X1 passing through a center point 406 of the first sensor 402 and a center point 408 of the second sensor 404. The center point 406 of the first sensor 402 is the center in both the length and width dimension of the first sensor 402, while the center point 408 of the second sensor 404 is the center in both the length and width dimension of the second sensor 406.

Because the first sensor 402 and the second sensor 404 are angled relative to each other, a longitudinal axis 410 of the first sensor 402 and a longitudinal axis 412 of the second sensor 404 are differently angled relative to the horizontal line X1. The longitudinal axis 410 of the first sensor 402 may form an angle 414 with the horizontal line X1. The longitudinal line 410 of the first sensor 402 has a positive slope relative to the horizontal line X1, and therefore, the angle 414 may be acute. The angle 414 may be from 35° to 55°, 40° to 50°, 42° to 48°, or 44° to 46°. In an example embodiment the angle 414 is 45°. The longitudinal axis 412 of the second sensor 402 may form an angle 416 with the horizontal line X1. The longitudinal axis 412 of the second sensor 404 has a negative slope relative to the horizontal line X1, and therefore, the angle 414 is obtuse. The angle 416 may be from 125° to 145°, 130° to 140°, 132° to 138°, or 134° to 136°. In an example embodiment the angle 416 is 135°. Under geometric principles, the longitudinal axis 410 of the first sensor 402 would also form an angle 418 with the horizontal line X1 that is complimentary to the angle 414 while the longitudinal axis 412 of the second sensor 404 would form an angle 420 with the horizontal line X1 that is complimentary to the second angle 416.

Because the longitudinal axis 410 of the first sensor 402 has a positive slope relative to the horizontal line X1 and the longitudinal axis 412 of the second sensor 404 has a negative slope relative to the horizontal line X1, the longitudinal line 410 of the first sensor 402 and the longitudinal line 412 of the second sensor 404 will intersect to form an angle 422. For the same reason, as shown in FIG. 7, the longitudinal line 410 of the first sensor 402, the longitudinal line 412 of the second sensor 404, and the horizontal line X1 will intersect to form a triangle. Under geometric principles, the angles 414, 420, 422 add up to 180°. The angle 422 may be from 70° to 110°, 80° to 100°, 84° to 96°, or 88° to 92°. In an example embodiment the angle 422 is 90°. In an example embodiment, the angle 414 is 45°±1° (thus the angle 418 is 135°±1°), the angle 416 is 135°±1° (thus the angle 420 is 45°±1°) and the angle 422 is 90°±1°). Based on the above-described geometry, it can thus also be said that the first sensor 402 and the second sensor 404 are perpendicular to each other or substantially perpendicular to each other.

As noted above, because the sensors 402, 404 are angled, the length of the sensor will be greater than (or equal to) the width 139 of the faceplate 133 in order to span the entire width 139 of the faceplate 133. Under geometric principles, the smaller the angle 414 and the greater the angle 416, the longer the sensors will need to be to span the entire width of the faceplate. Based on the above-listed options for the magnitude of the angles, the ratio of the length of each sensor to the width of the faceplate may be 1.4:1 to 1.45:1. In one example embodiment ratio of the length of each sensor to the faceplate may be $1:\sqrt{2}$.

While FIG. 7 shows an embodiment that is preferred because it allows for the least amount of moving of the positioning stage 106 to obtain the appropriate data, it is possible for the first sensor 402 and the second sensor 404 to be positioned anywhere on the applique 107 at any relative angle and any at distance apart from each other in both the X and Y dimensions. However, as described below, in such embodiments, more control and precise positioning is necessary by the stage to properly orient the sensors to obtain the appropriate data. Additional positioning would also require additional time to collect the appropriate data.

Figure 8:
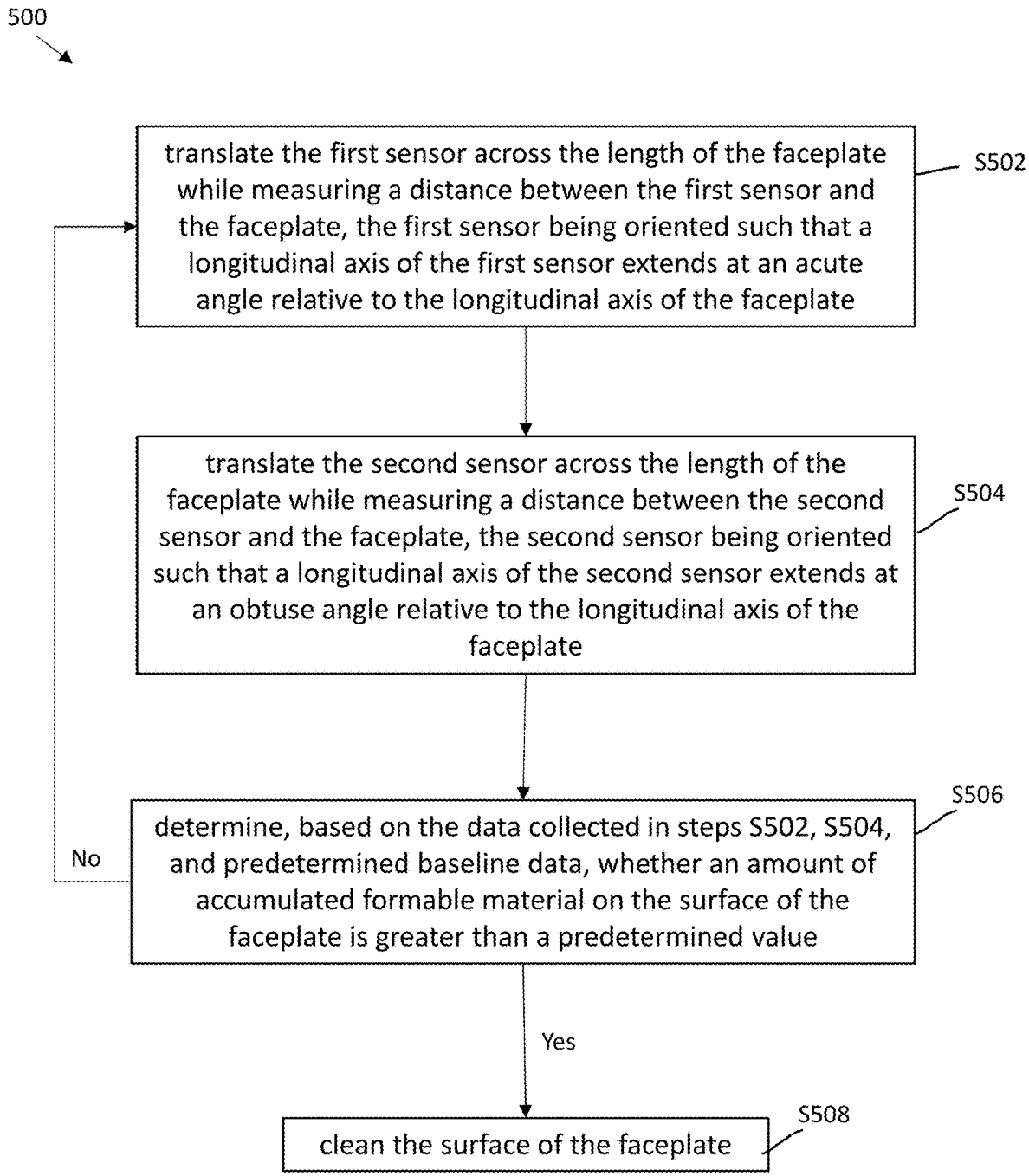
FIG. 8 shows a flowchart of a method of detecting accumulation of formable material on the surface of the faceplate of the dispenser shown in FIGS. 4A to 5B in accordance with the first example embodiment.

FIG. 8 shows a flowchart of a method 500 of detecting accumulation of formable material on the surface 135 of the faceplate 133 of the dispenser shown in FIGS. 4A to 5B. The method 500 begins with step S502, where the first sensor 402 is translated across the length 127 of the faceplate 133 while measuring a distance d between the first sensor 402 and the faceplate 133, the first sensor 402 being oriented such that a longitudinal axis 410 of the first sensor 402 extends at an acute angle 414 relative to the longitudinal axis 141 of the faceplate 133. In the example embodiment shown in FIGS. 6A to 7, as discussed above, the first sensor 402 and the second sensor 404 are centered along the horizontal axis X1 and are angled relative to the horizontal axis X1 as described above. In this embodiment, step S502 may further include aligning the horizontal line X1 with the longitudinal axis 141 of the faceplate 133. In the first example embodiment, in order to align the horizontal line X1 with the longitudinal axis 141 of the faceplate 133, the positioning stage 106 need only be controlled to move in the X and Y dimensions. The applique 107 may be moved in the Y dimension until the horizontal line X1 overlaps with the longitudinal axis 141 of the faceplate 133. The positioning stage 106 may further be controlled to move the applique 107 in the X dimension until the first and second sensors 402, 404 are located to the left or to the right of the dispenser 122. FIG. 6A (and FIG. 10 discussed below) shows such an example where the first and second sensors 402, 404 have been properly positioned in the X and Y dimensions such that the horizontal axis X1 overlaps with the longitudinal axis 141 of the faceplate 133 and such that the first and second sensors 402, 404 are located to the right of the dispenser 122.

After the first and second sensors 402, 404 are positioned as described above, performing step S502 further includes controlling the stage 106 to move the applique 107 in a direction 424 along the X dimension. Because the horizontal line X1 is aligned with the longitudinal axis 141 of the faceplate 133, the movement of the applique 107 along the X dimension in the direction 424 will translate the first sensor 402 across the length 127 of the faceplate 133. Furthermore, due to the above-described geometry of the first and second sensors 402, 404 relative to the horizontal line X1, the first sensor 402 is oriented such that the longitudinal axis 410 of the first sensor 402 extends at an acute angle 414 relative to the longitudinal axis 141 of the faceplate 133. During the translating of the first sensor 402, the sensor is controlled to sense to measure the distance d between the first sensor 402 and the faceplate 133.

Figure 9:
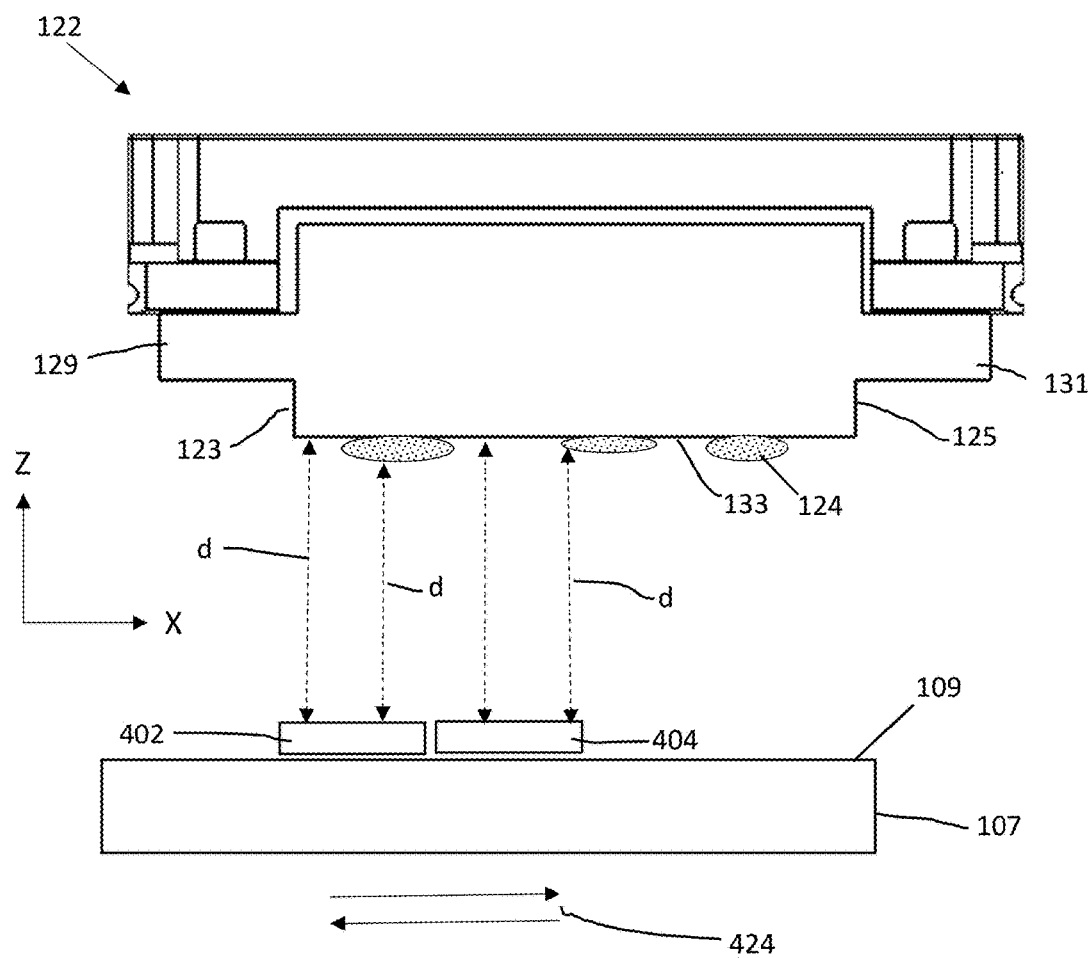
FIG. 9 shows a schematic side view of the first and second sensors passing underneath the faceplate in accordance with the first example embodiment.

FIG. 9 shows a schematic side view of the first and second sensors 402, 404 passing underneath the faceplate 133. As shown in FIG. 9, the first and second sensors 402, 404 are located a distance from the faceplate 133 in the Z dimension. As the first and second sensors 402, 404 pass underneath the faceplate 103 in the direction 424 in the X dimension, the first and second sensors 402, 404 measure the distance d between the sensor and the faceplate. As shown in FIG. 9, because there is formable material 124 formed on the surface 135 of the faceplate 133, the distance d between the faceplate 133 and the first and second sensors 402, 404 varies depending on the thickness of the formable material 124. Thus, as shown in FIG. 9, when there is no formable material at a particular location the distance d is longest and when the formable material is thickest, the distance d is smallest. As further shown in FIG. 9, the direction 424 can be either direction along the X dimension. For example, in the embodiment shown in FIG. 6A where the first and second sensors 402, 404 begin to the right of the dispenser 123, the direction of travel would be to the left. However, if the first and second sensor 402, 404 begin to the left of the dispenser 122, then the direction of travel would be toward the right. There is no movement in the Z or Y dimension during the process of recoding the distance data.

Figure 10:
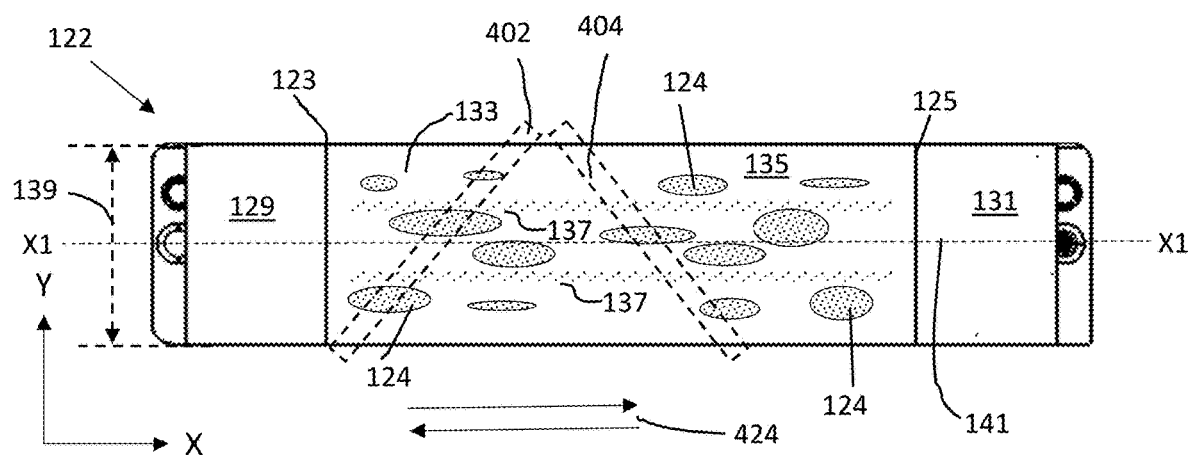
FIG. 10 shows a bottom view of the faceplate with the first and second sensors superimposed onto the surface of the faceplate in accordance with the first example embodiment.

FIG. 10 shows a bottom view of the faceplate 133 with the first and second sensors 402, 404 superimposed onto the surface 135 of the faceplate 133. That is, while the first and second sensors 402, 402 are at a distance underneath the faceplate 133 in the Z dimension as shown in FIG. 9, the superimposition of the first and second sensors 402, 404 onto the faceplate 133 assist in demonstrating the angles of the first and second sensors 402, 404 relative to the longitudinal axis 141 of the faceplate 133. As seen in FIG. 10, the horizontal line X1 and the longitudinal axis 141 of the faceplate 133 overlap each other once properly aligned in the manner described above. Thus, once aligned, the angles described above with respect to FIG. 7 are also present in FIG. 10. Accordingly, the first sensor 402 is angled acutely and the second sensor is angled obtusely relative to the longitudinal axis 141 of the faceplate 133. As also shown in FIG. 10, the first and second sensors 402, 404 span the entire width 139 of the faceplate 133. Thus, as the first and second sensors 402, 404 are translated in the direction 424 along the X dimension (either to the right or left as noted above), each of the first and second sensors 402, 404 measure distances d along the entire width 139 of the faceplate 133.

The geometry of FIG. 7 and FIG. 10 can also be described as the first sensor 402 and the second sensor 404 are oriented such that the longitudinal axis 410 of the first sensor 402, the longitudinal axis 412 of the second sensor 402, and the longitudinal axis 141 of the faceplate 133 (or the horizontal line X1), when projected onto a horizontal plane, intersect to form a triangle having the two acute angles 414, 420. More particularly, the triangle would have the same angles 414, 420, and 422 as described above.

In summary, step S502 may be performed by a) controlling the positioning stage to align horizontal line X1 with the longitudinal axis 141 of the faceplate 133, b) controlling the stage to translate the first sensor 402 across the length 127 of the faceplate along the X dimension, c) while measuring the distance between the first sensor 402 and the faceplate 133.

The method 500 may then proceed to step S504, where the second sensor 404 is translated across the length 127 of the faceplate 133 while measuring a distance d between the second sensor 404 and the faceplate 133, the second sensor 404 being oriented such that a longitudinal axis 412 of the second sensor 404 extends at an obtuse angle 416 relative to the longitudinal axis 141 of the faceplate 133. Because the horizontal line X1 was already aligned with the longitudinal axis 141 of the faceplate 133 in step S502, and because the second sensor 404 is positioned adjacent to the first sensor 402 as shown in FIG. 6A and FIG. 7, the above-described controlling of the stage 106 to move the applique 107 in a direction 424 along the X dimension will also translate the second sensor 404 across the length 127 of the faceplate 133. Furthermore, due to the above-described geometry of the first and second sensors 402, 404 relative to the horizontal line X1, the second sensor 404 is oriented such that the longitudinal axis 412 of the second sensor 404 extends at an obtuse angle 416 relative to the longitudinal axis 141 of the faceplate 133. That is, in the example embodiment shown in FIGS. 6A to 7, 9 and 10, the translation of the first sensor 402 occurs simultaneously with the translation of the second sensor 404. During the translating of the second sensor 404, the sensor is controlled to measure the distance d between the second sensor 404 and the faceplate 133. In summary, step S504 may be performed in the same manner as step S502, and indeed may occur simultaneously with step S502. However, because the sensors move in X dimension, and because the sensors are located adjacent each other in the X dimension, even though the sensors may be moved simultaneously, the first sensor will translate across the faceplate prior to the second sensor translating across the faceplate (when traveling to the left, with the opposite order occurring when traveling to the right). Thus, it can also be said that the sensors translate across the faceplate successively even while moving simultaneously.

While the example embodiment shown in FIGS. 6A to 7, 9 and 10 requires relatively few motions to pass the sensors across the length of the faceplate, other embodiments are possible where the first and second sensors 402, 404 are not oriented in the manner described above. Rather, each of the first and second sensors can be arbitrarily placed anywhere on the applique 107, including any location and any angle relative to each other. However, in such embodiments, there will need to be more complex controlling of the stage so that the first sensor ultimately passes across the faceplate in the geometry shown in FIG. 10. For example, if the first sensor is far away from the second sensor and not preemptively angled acutely relative to a horizontal line that is parallel to the longitudinal axis of the faceplate, step S502 would include using the stage to move the applique until the first sensor is located at the correct X and Y position, and then further rotating the applique until the first sensor is angled relative to the longitudinal axis 141 of the faceplate 133 in the manner shown in FIG. 10. Then, the stage would be controlled to pass the first sensor across the length of the faceplate while measuring the distance between the first sensor and the faceplate. In same manner, if the second sensor is far away from the first sensor and not preemptively angled obtusely relative to a horizontal line that is parallel to the longitudinal axis of the faceplate, step S504 would also include using the stage to move the applique until the second sensor is located at the correct X and Y position, and then further rotating the applique until the second sensor is angled relative to the longitudinal axis 141 of the faceplate 133 in the manner shown in FIG. 10. Then, the applique would be controlled to translate second sensor across the faceplate.

During the translating of each of the first and second sensors across the length of the faceplate, each sensor will continuously measure and provide distance data. In an example embodiment, each sensor may measure data at a rate of about 20,000 measurements per second. The overall number of measurements taken by each of the sensors will depend on the speed of travel of the positioning stage 106 and the length of the faceplate. In an example embodiment, the position stage 106 may travel at a speed of about 1.5 m/s and the length of the faceplate is about 70 mm. Under these example conditions, it would take about 0.05 seconds for the sensors to pass across the faceplate and about 1000 data points would be measured for each sensor. In other example embodiments, the time for the sensors to pass across the faceplate may be from 0.01 to 0.1 seconds. In an example embodiment, the time for the sensors to pass across the faceplate has no impact or less than 1% impact on the average time between the start of production of one substrate and the start of production of the next substrate.

Figure 11:
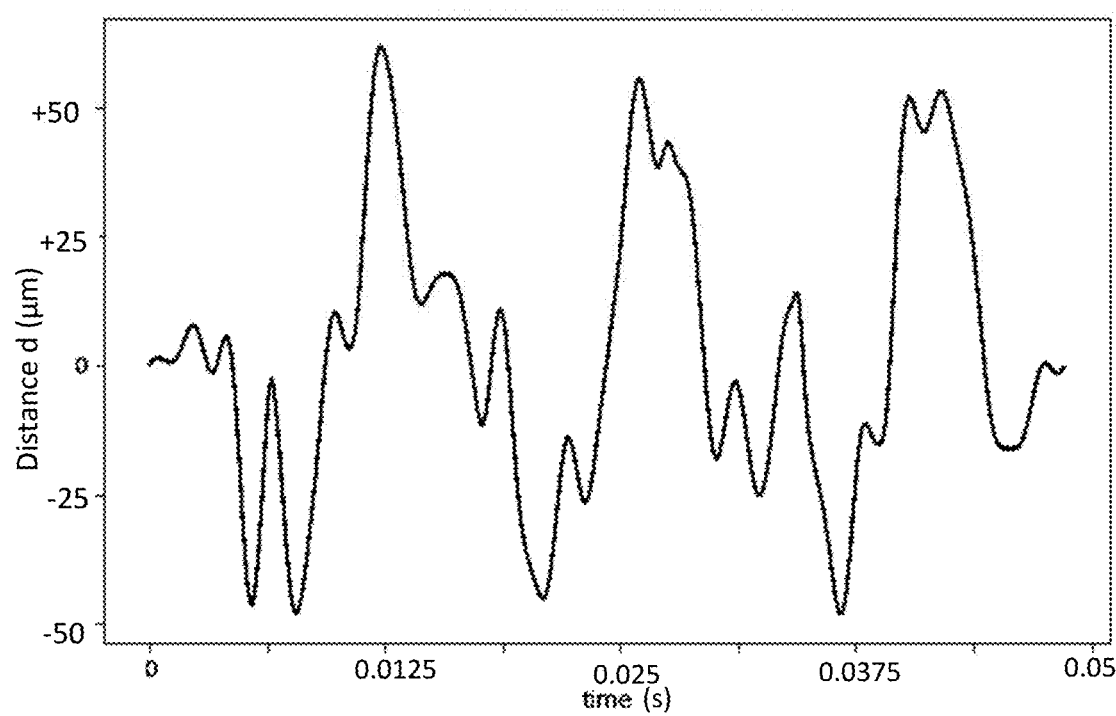
FIG. 11 shows a chart of distance data collected by the first sensor in an accordance with the first and second example embodiments.
Figure 12:
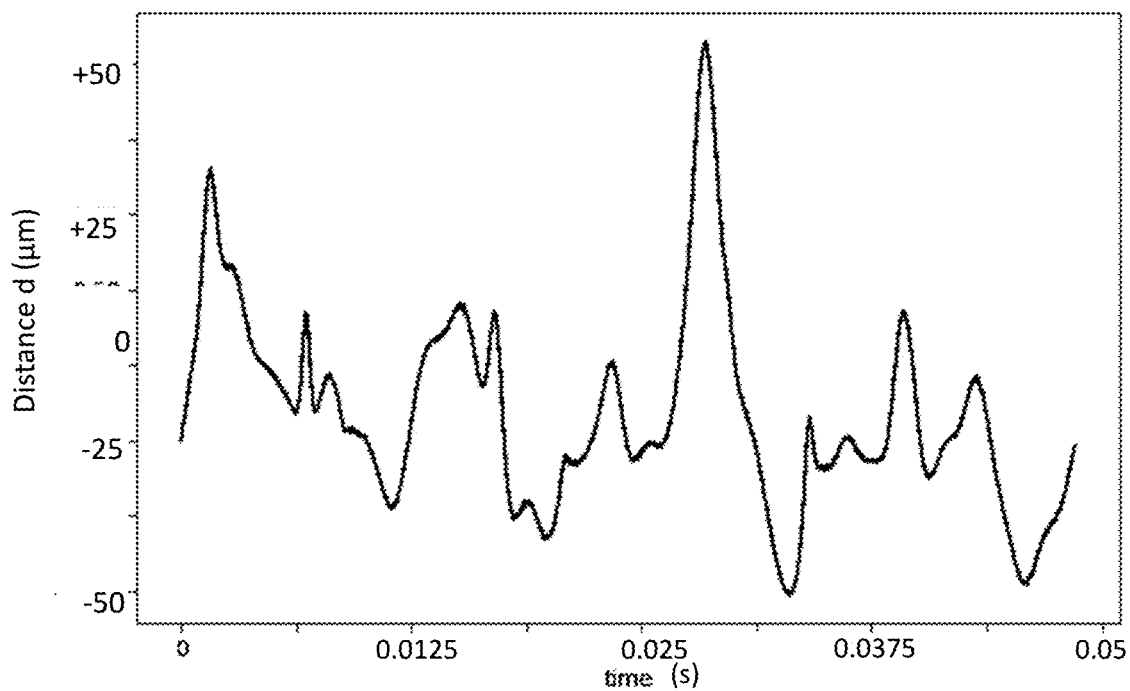
FIG. 12 shows a chart of distance data collected by the second sensor in an accordance with the first and second example embodiments.

FIG. 11 shows a chart 600 of distance data collected by the first sensor 402 in an example embodiment. FIG. 12 shows a chart 700 of distance data collected by the second sensor 404 in an example embodiment. As shown in FIGS. 11 and 12, the x-axis in each chart represents time (seconds in the example embodiment), where each time correlates to a particular relative location of the sensor with respect to the faceplate. The y-axis in each chart 500, 600 represents the distance d in micrometers (i.e., the distance between the senor and the faceplate in the Z dimension) measured by the sensor at the particular time relative to a reference plane. Thus, the chart 600 of FIG. 11 shows the measured distance d at different locations for the first sensor 402 and the chart 700 shows the measured distance d at different locations for the second sensor 404. The reference plane may be arbitrarily chosen. In the example shown in FIG. 11, the reference plane (i.e., the "0" distance) is located at a midpoint of the faceplate along the Z dimension. Thus, some distances are positive values when the surface point being measured is below the reference plane in the Z dimension and some distance are negative values when the surface point being measured is above the reference plane in the Z dimension. Using this data, one can determine what distance d was measured by the first sensor and what distance d was measured by the second sensor for the same relative location. The use of this data is further described below.

After collecting the distance data d from the first sensor 402 and the second sensor 404, the method may proceed to step S506, where it is determined, based on the data collected in steps S502, S504, and predetermined baseline data, whether an amount of accumulated formable material on the surface of the faceplate is greater than a predetermined value. The predetermined baseline data is data acquired for the faceplate 133 prior to any accumulation of formable material on the surface 135, i.e., the clean faceplate shown in FIGS. 4A and 4B. The manner of collecting the baseline date is the same as discussed above with respect step S502 and step S504. That is, step S502 and step S504 are performed such that the first sensor 402 and the second sensor 404 are translated across the surface of the clean faceplate 133, and being angled in the manner described above. In other words, the only difference between the collection of the baseline data and the data described above is that the baseline data is collected when it known that there is no formable material on the surface 135 of the faceplate 133. Thus, the acquisition of the baseline data may be performed after the surface 135 of the faceplate 133 has been cleaned and before the dispenser has been used to dispense formable material (or prior to the very first use of the dispenser). The baseline data therefore represents the distance data d between each of the sensors 402, 404 and the faceplate 133 when there is no accumulated formable material on the surface of the faceplate. The acquiring of the baseline data is not indicated as part of the method 500 shown in FIG. 8 because the acquisition of the baseline data generally occurs a single time prior to performing the method 500. However, in another embodiment, the step of acquiring the baseline data can be considered part of the method 500 and would occur prior to step S502.

Figure 13:
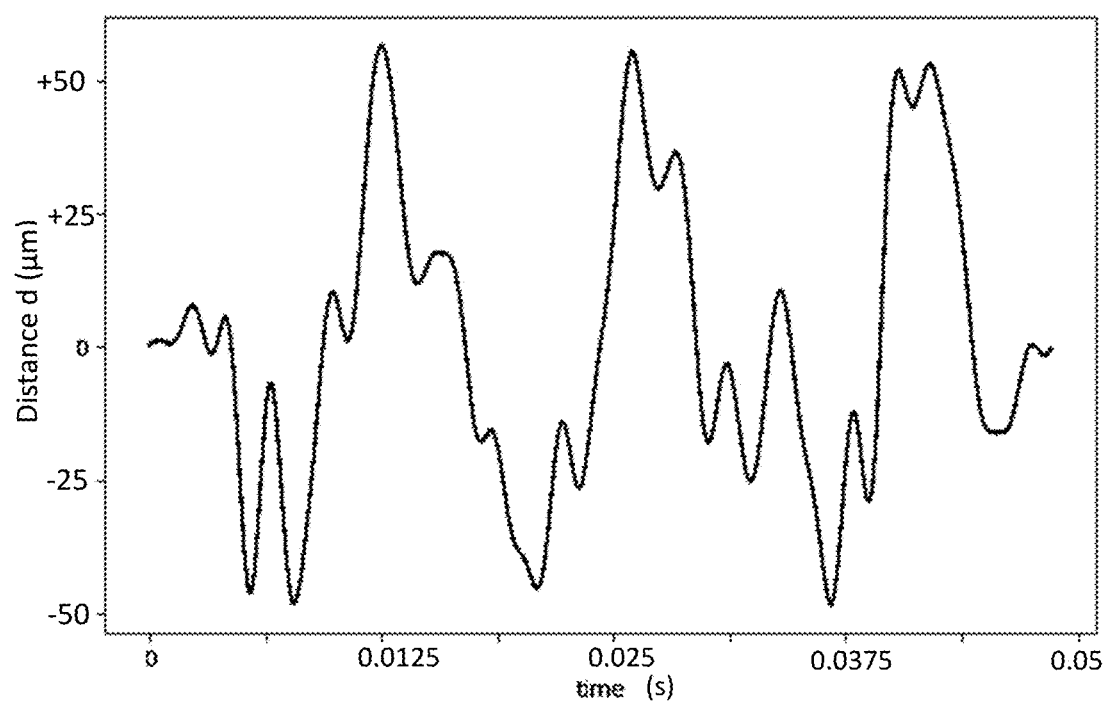
FIG. 13 shows a chart of baseline distance data collected by the first sensor in an accordance with the first and second example embodiments.
Figure 14:
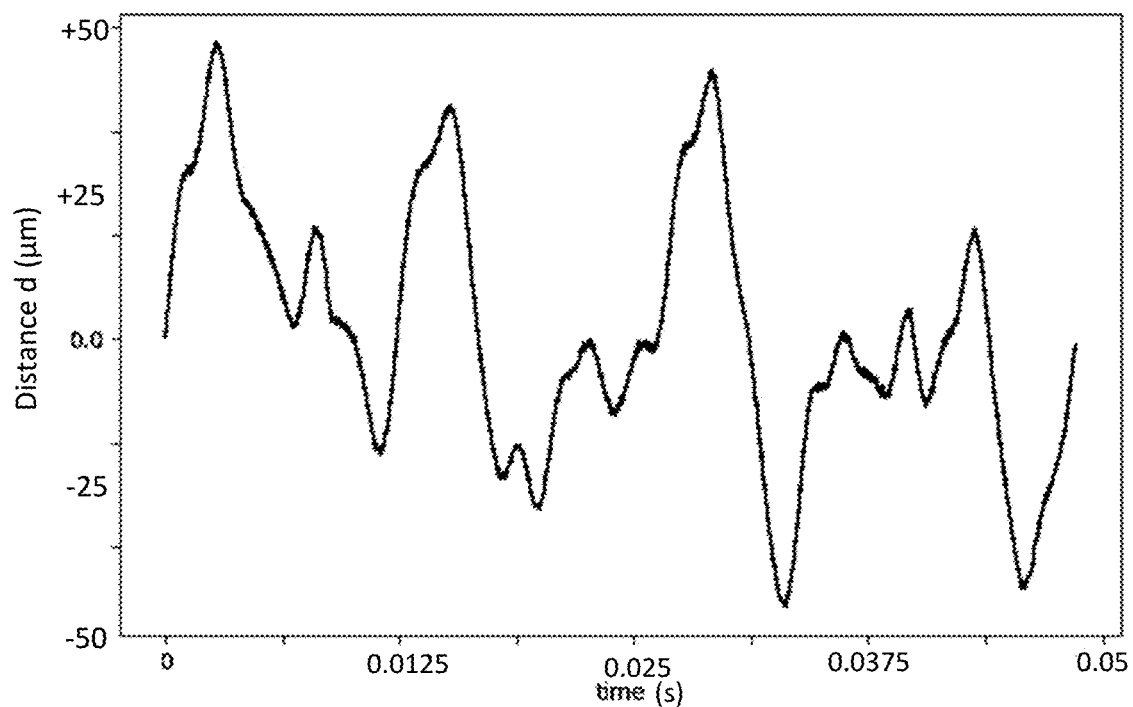
FIG. 14 shows a chart of baseline distance data collected by the second sensor in an accordance with the first and second example embodiments.

Example baseline data for the first sensor 402 is shown in FIG. 13 and example baseline data for the second sensor 404 is shown in FIG. 14. FIG. 13 shows a chart 800 of distance data collected by the first sensor 402 when the faceplate has no accumulated formable material and FIG. 14 shows a chart 900 of distance data collected by the second sensor 404 when the faceplate has no accumulated formable material. As with charts 600, 700, the x-axis in each of charts 800, 900 represents time (seconds in the example embodiment), where each time correlates to a particular relative location of the sensor with respect to the faceplate. Thus, the chart 700 of FIG. 13 shows the measured distance d at different relative locations for the first sensor 402 when the faceplate has no accumulated formable material and the chart 700 shows the measured distance d at different relative locations for the second sensor 404 when the faceplate has no accumulated formable material.

Figure 15:
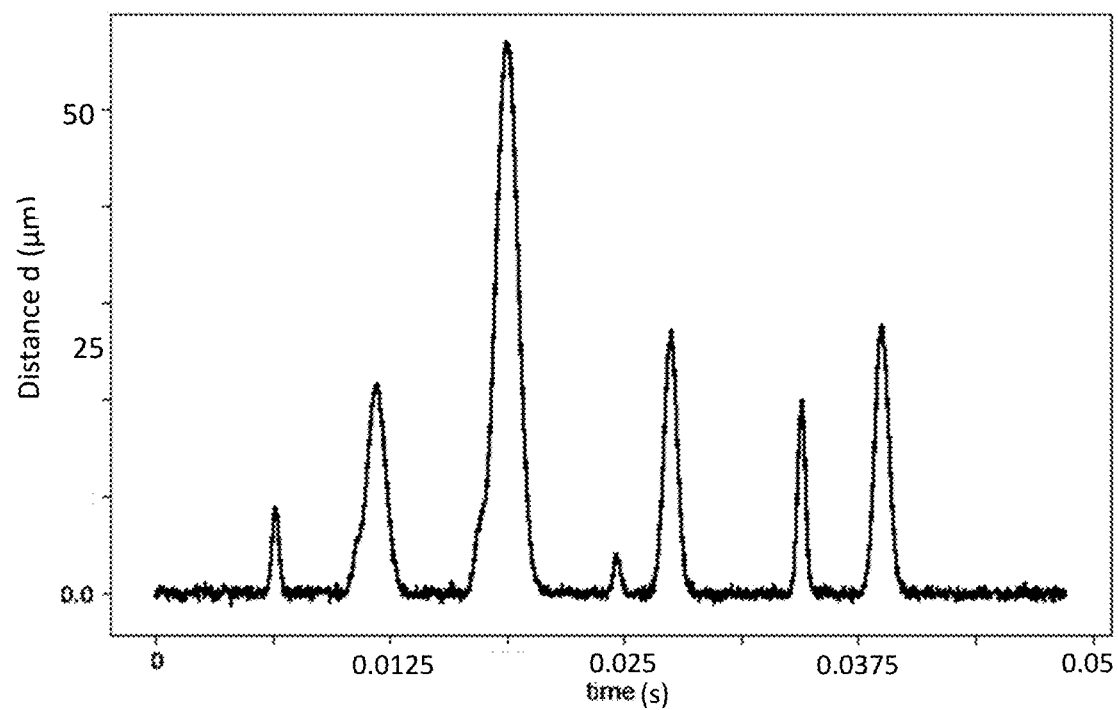
FIG. 15 shows a chart of distance data collected by the first sensor of FIG. 11 after subtracting the baseline data of FIG. 13 in an accordance with the first and second example embodiments.
Figure 16:
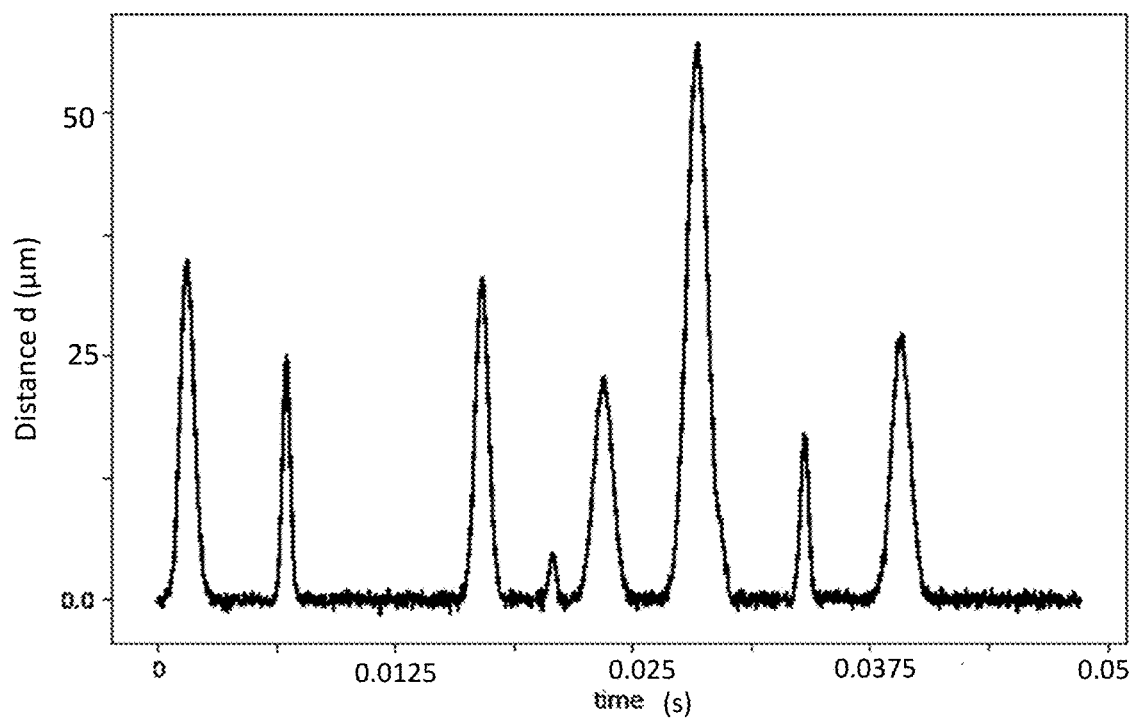
FIG. 16 shows a chart of distance data collected by the second sensor of FIG. 12 after subtracting the baseline data of FIG. 14 in an accordance with the first and second example embodiments.

As stated above, step S506 includes determining, based on the data collected in steps S502, S504, and predetermined baseline data, whether an amount of accumulated formable material on the surface of the faceplate is greater than a predetermined value. This step may include subtracting the data collected in steps S502, S504 from the baseline data. More particularly, as described above, the baseline data includes distance d measurements for the first sensor (FIG. 13) and distance d measurements for the second sensor (FIG. 14) when there is no formable material accumulated on the faceplate. The data collected in step S502 would be subtracted from the baseline data corresponding to the first sensor 402 and the data collected in step S504 would be subtracted from the baseline data corresponding to the second sensor 404. After the subtraction, the resulting data for each sensor would represent only the thickness of the accumulated formable material at a particular location. That is, by subtracting out the distance when there is formable material from the distance when there is no formable material, the result must be the thickness of the formable material at the particular location. FIG. 15 shows a chart 1000 of distance data acquired by the first sensor 402 after subtracting from the baselines data of the first sensor 402 and FIG. 16 shows a chart 1100 of distance data acquired by the second sensor 404 after subtracting from the baseline data of the second sensor 404. As with charts 600, 700, 800, 900 the x-axis in each of charts 1000, 1100 represents time (seconds in the example embodiment), where each time correlates to a particular location of the sensor relative to the length of the faceplate. Thus, the chart 1000 of FIG. 15 shows the thickness of the formable material at different locations for the first sensor 402 and the chart 1200 shows the thickness of the formable material at different locations for the second sensor 404.

Figure 17A:
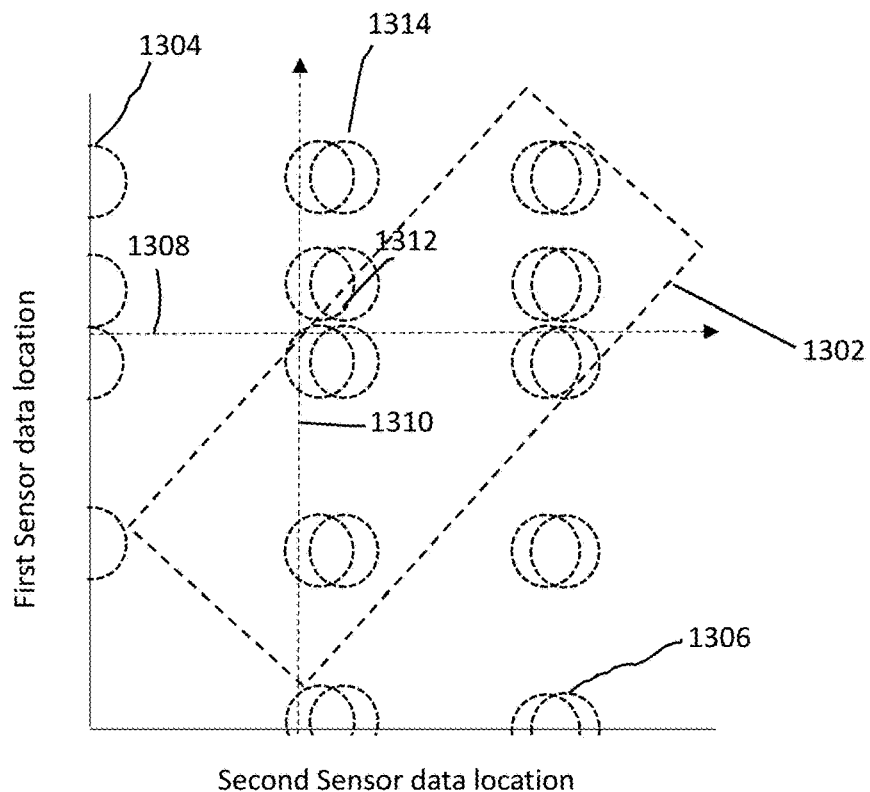
FIG. 17A shows a schematic representation of the accumulation location probabilities in accordance with an example embodiment.

After obtaining the data shown in FIGS. 15 and 16, step S506 may further include calculating probabilities of where formable material is located on the X-Y plane defined by the surface of the faceplate. FIG. 17A shows a schematic visual representation of calculating the accumulation location probabilities. In FIG. 17A, the x-axis represents the location of data acquired by the second sensor after subtracting from the corresponding baseline data, while the y-axis represents the location of data acquired by the first sensor after subtracting from the corresponding baseline data. For each sensor, each recorded data point corresponds to a physical location taken at an angle on the faceplate. That is, as discussed above, and best seen in FIG. 10, each data point taken by each sensor can be treated as being taken along a straight line that is angled relative to the longitudinal axis 141 of the faceplate. Thus, by rotating the perspective by 45° (when the angle 414 is 45°, the angle 420 is 45°, and the angle 422 is 90°), such that the first and second sensor data positions are made into the horizontal and vertical axes, the two-dimensional planar area 1302 defined by the faceplate 133 can be projected onto the graph as shown in FIG. 17A. Because the location where each data point is collected is known based on the timing of the measurement, it is possible to plot the data on the x-axis and the y-axis at the physical point along the travel path that that sensor measured a distance smaller than the baseline. The first sensor data points 1304 are shown schematically on the y-axis and the second sensor data points 1306 are shown schematically on the x-axis. Each data point indicates that, after subtracting from the baseline data, the sensor measured some distance greater than zero at a particular location along the travel path.

Because the data point represents the entire length of the particular sensor, the data reported could represent formable material being present at any location along the length of the sensor. However, by extrapolating the y-axis data across the x-axis (i.e., the direction that the first sensor extended across the faceplate) and by extrapolating the x-axis data across the y-axis (i.e., the direction that the second sensor extended across the faceplate), the intersection point the extrapolations indicate a possible location of formable material on the faceplate. For example, dashed line 1308 shows one example of extrapolating the first sensor data across faceplate and dashed line 1310 shows one example of extrapolating the second sensor data across the faceplate. Each of these dashed lines 1308, 1310 represent how the sensors overlapped the faceplate at that particular moment when the data was recorded. The intersection point of these two example lines 1308, 1310 result in the data 1312, which appears on the area 1302 representing the surface of the faceplate. However, as shown in FIG. 17A, when the extrapolation principle is applied to all of the data, some of the data appears outside of the area 1302. For example, data 1314 falls outside of the area 1302. After extrapolating, any data appearing outside the area 1302 can be removed from consideration because it cannot possibly represent actual data points. The data appearing within the area 1302 can all represent potential locations of formable material.

An example algorithm for performing the process of determining the possible locations of accumulation based on the data shown in FIGS. 11 to 16 is as follows. The data collected by the first sensor (FIG. 11) is subtracted from the corresponding baseline data collected by the first sensor (FIG. 12) and the data collected by the second sensor (FIG. 13) is subtracted from the corresponding baseline data collected by the second sensor (FIG. 14). The resulting difference data for the first sensor (FIG. 15) is entered into a first matrix and the resulting difference data for the second sensor (FIG. 15) is entered into a second matrix. In the first matrix, all of the data points (e.g., thousands or tens of thousands of data points) are entered in a first row. The first row is then copied as a second row, a third row, and so on until the number of rows is equal to the number of data points (e.g., thousands or tens of thousands of rows). In the second matrix, all of the data points (e.g., thousands or tens of thousands of data points) are entered in a first column. The first column is then copied as a second column, a third column, and so on until the number of columns is equal to the number of data points (e.g., thousands or tens of thousands of columns). Preferably, the number of data points taken by the first sensor is the same number of data points taken by the second sensor. Thus, the first matrix and the second matrix preferably contain the same number of rows, columns, and cells. Next, the dot product of the two matrices is calculated, thereby providing a third matrix having the same number of cells as the first and second matrices. Then, the third matrix data is normalized by dividing each data point (i.e., each cell) of the third matrix by the mean of the sums of both the first matrix and the second matrix. That is, the sum of all the data of the first matrix is averaged with the sum of all the data in the second matrix, and then every cell of the third matrix is divided by this value, resulting in a fourth matrix. Because the time at which each data point was taken is known, and because the time correlates with a position relative to the faceplate, each of the data cells of the fourth matrix can be mapped onto the two-dimensional space described above with respect to FIG. 17A.

Figure 17B:
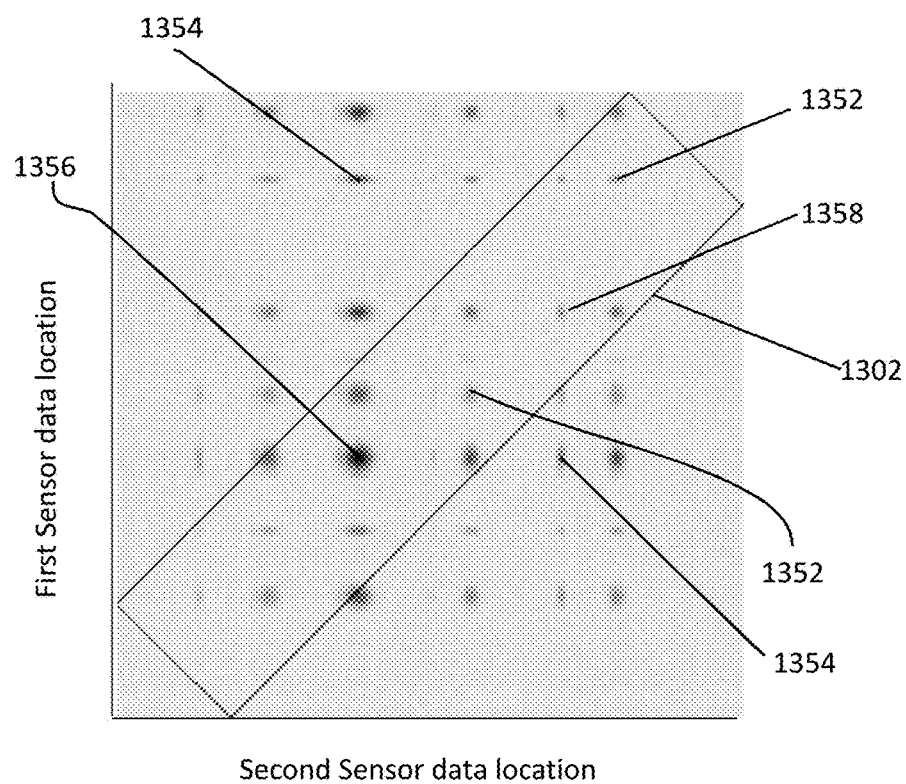
FIG. 17B shows an example representation of accumulation location probabilities calculated from the data shown in FIGS. 15 and 16.

FIG. 17B shows an example representation of the data points of FIGS. 15 and 16 after performing the above-described algorithm and plotting the resulting fourth matrix data onto the two-dimensional space. As shown in FIG. 17B, the same two-dimensional planar area 1302 defined by the faceplate 133 in FIG. 17A is projected onto the same x-axis and y-axis. As discussed above, the data of the fourth matrix can be plotted onto the x-axis and y-axis based on the time that the data point was taken because the time correlates with the particular location of the sensor relative to the faceplate at the moment the data was measured. FIG. 17B includes data 1352 falling within the two-dimensional planar area 1302 and data 1354 falling outside two-dimensional planar area 1302. As shown in FIG. 17B the plotted data includes relatively larger data points 1356 and relatively smaller data points 1358. The size of the data points are based on the magnitudes of the values in the fourth matrix. Thus, FIG. 17B provides a visual indication of the relative magnitude of accumulation at various possible locations on the surface of the faceplate. While the chart of FIG. 17B provides visual information to the operator to quickly assess where the accumulation may be present, it is not necessary for the chart of FIG. 17B to be generated. Rather, in another example embodiment it is possible for the computer performing the method to analyze the data, determine where the data points appear, and then perform the additional steps described below without ever generating the image.

After determining which data points are possibly located on the surface of the template, step S506 may further include comparing each of these data points to a predetermined threshold value. The predetermined threshold value is an amount of accumulation that is predetermined to warrant cleaning of the faceplate. For example, the threshold value may be equivalent to a single peak above 60 μm or five peaks that are above 40 μm. For example, if the data collected in FIGS. 15 and 16 results a single peak above 60 μm or five peaks that are above 40 μm, where those peaks are possibly present in on the surface of faceplate, the threshold would be met. Thus, if the data points determined to possibly be present on the surface of the faceplate is greater than this value, then the answer is "yes" to step S506, and the method proceeds to step S508 where the surface of the faceplate is cleaned. If none of the data points determined to possibly be present on the surface of the faceplate is greater than the predetermined value, then the answer to step S506 is "no" and the method returns to step S502 after a predetermined number of further dispenses by the dispenser is performed or after a predetermined amount of time has passed. The predetermined amount of dispenses or predetermined amount of time may be based on previously collected prediction data or based on how far away the largest data point possibly on the faceplate is from the predetermined value. For example, in one embodiment, regardless of how far away the largest data point possibly on the faceplate is from the predetermined value, steps S502 to S506 may be repeated after every 1 to 3 million drops are dispensed, after approximately 1 μL of drops are dispensed, or after 12 to 48 hours of dispensing drops based on historical estimates of how fast formable material accumulates. In another embodiment, if it is determined that the largest data point possibly on the surface of the faceplate is very far from the predetermined value, then more dispenses or more time may be used before repeating steps S502 to S506. On the other hand, if it is determined that the largest data point possibly on the surface of the faceplate is very close to exceeding the thresholds for cleaning, then less dispenses or less time may be used before repeating step S502 to S506.

Figure 18:
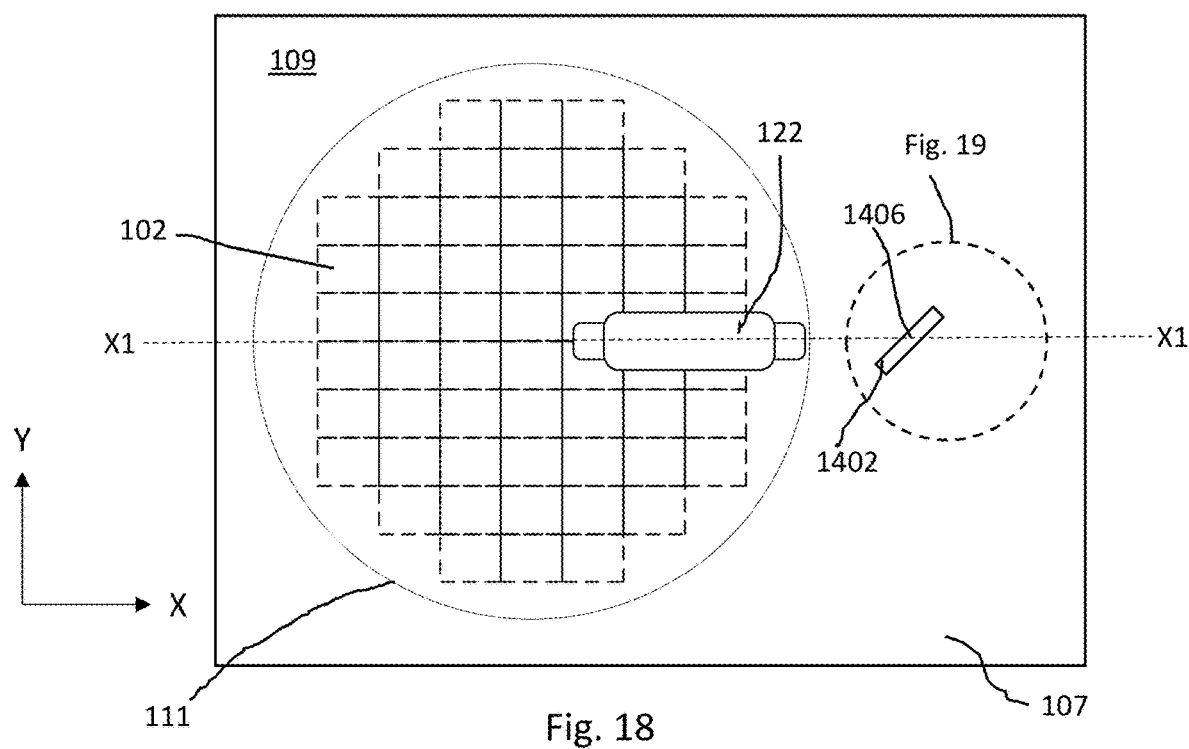
FIG. 18 shows a top view of the applique with the dispenser overhead the substrate in accordance with a second example embodiment.

FIGS. 18-21B illustrate a second example embodiment. The embodiment shown in FIGS. 18-21B is similar the above-described embodiment, but instead of having two sensors, there is only one single sensor 1402. FIG. 18 shows a top view of the applique 107 with the dispenser 122 overhead the substrate 102 in accordance with the second example embodiment. FIG. 18 shows a similar view as FIG. 6A, and the same reference numbers are used to represent the same elements as in FIG. 6A. As shown in FIG. 18, the difference in the second embodiment is that there is a single sensor 1402 instead of two sensors. The single sensor 1402 may be the same as the first sensor 402 or the same as the second sensor 404.

Figure 19:
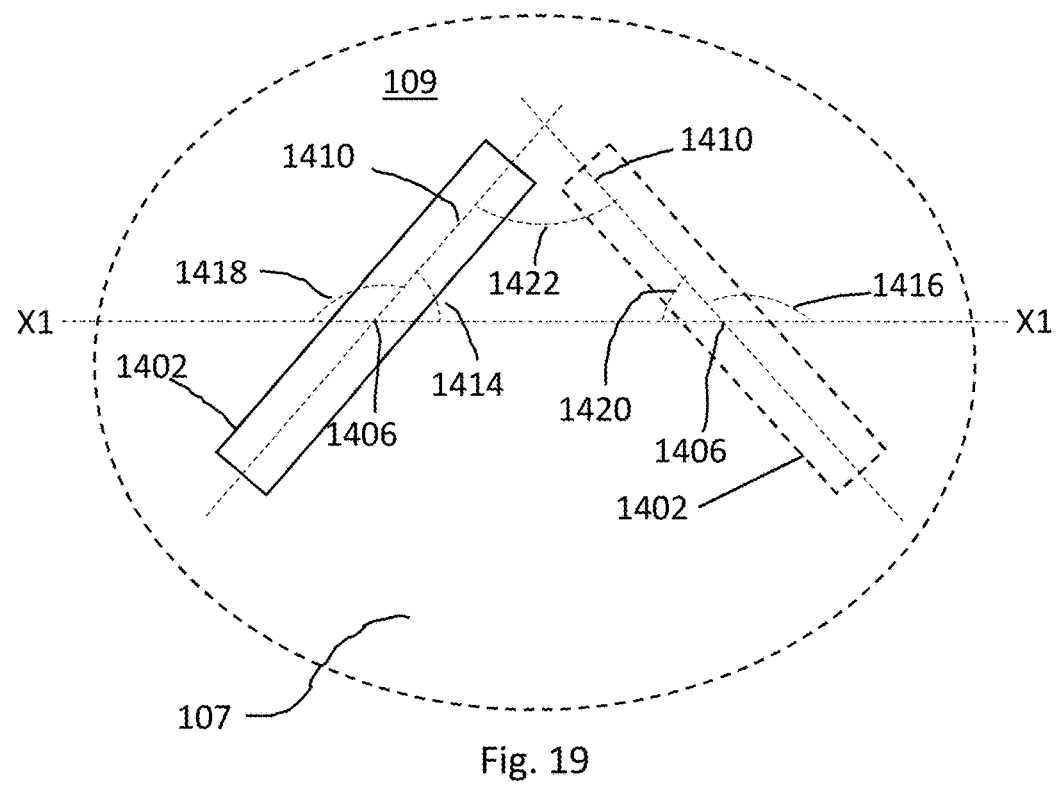
FIG. 19 shows a close up view of a portion of the applique of FIG. 18 having a single sensor on the surface as well as a superimposition of the single sensor after it has been rotated in accordance with the second example embodiment.

FIG. 19 shows a close up view of a portion of the applique 107 having the single sensor 1402 on the surface 109 as well as a superimposition of the single sensor 1402 after it has been rotated. The superimposed single sensor 1402 is indicated in dashed line. As seen in FIG. 19, the single sensor 1402 is angled with respect to the horizontal line X1 passing through a center point 1406 of the single sensor 1402, similar to the first embodiment. As with the first sensor 402, the center point 1406 of the single sensor 1402 is the center in both the length and width dimension of the single sensor 1402. Because the single sensor 1402 is angled relative to the horizontal line X1, the longitudinal axis 1410 of the single sensor 1402 may form a first angle 1414 with the horizontal line X1. In the illustrated second example embodiment, as with the first sensor 402, the longitudinal line 1410 of the single sensor 1402 has a positive slope relative to the horizontal line X1, and therefore, the first angle 1414 may be acute. The first angle 1414 may be the same as the first angle 414 of the first embodiment. Under geometric principles, the longitudinal axis 1410 of the single sensor 1402 would also form a second angle 1418 with the horizontal line X1 that is complimentary to the first angle 1414. That is, the second angle 1418 may be same as the angle 418 in the first embodiment.

Figure 20:
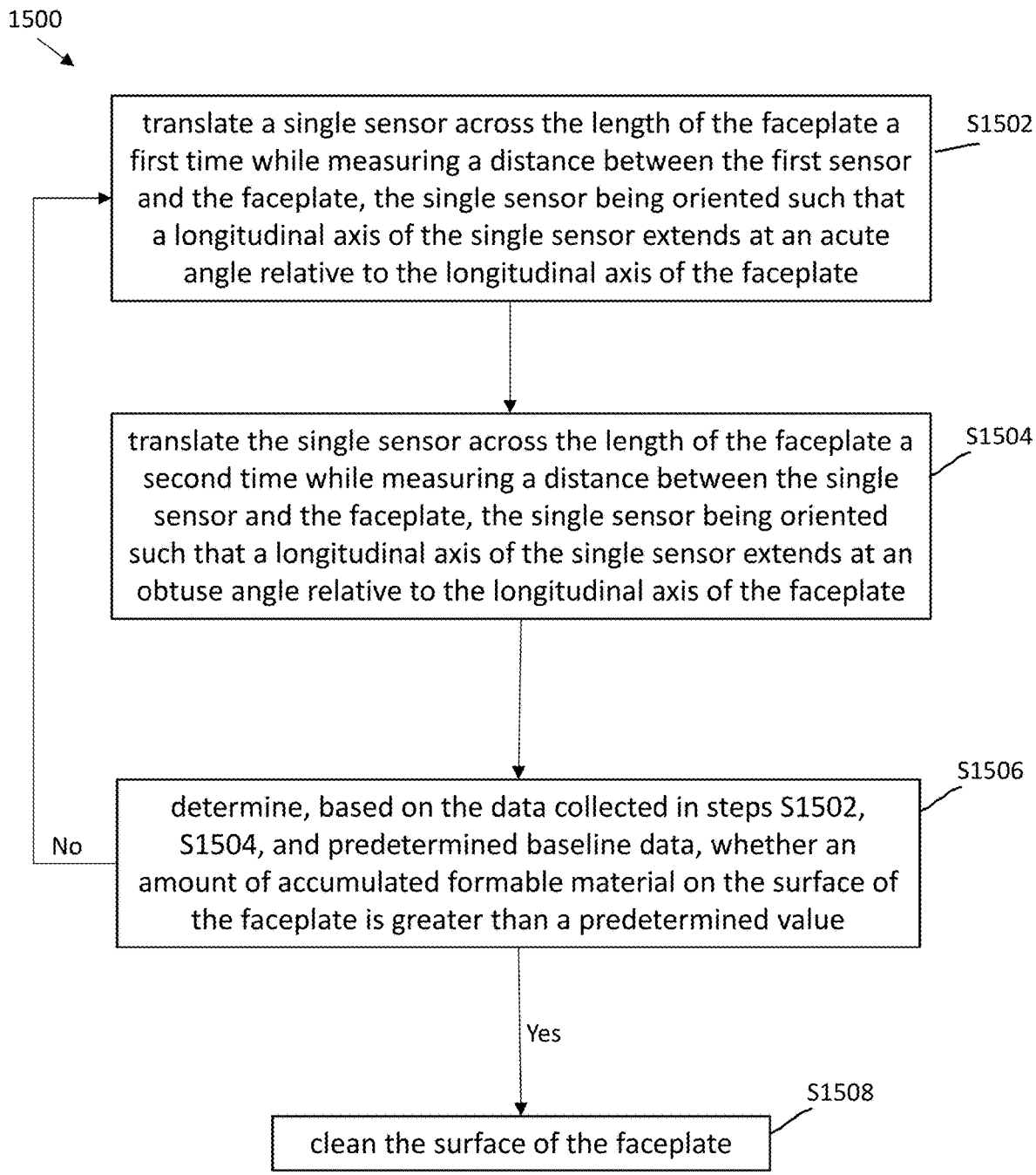
FIG. 20 shows a flowchart of a method of detecting accumulation of formable material on the surface of the faceplate of the dispenser shown in FIGS. 18 and 19 in accordance with the second example embodiment.

FIG. 20 shows a flowchart of a method 1500 of detecting accumulation of formable material on the surface 135 of the faceplate 133 of the dispenser shown in FIGS. 18 and 19 in accordance with the second example embodiment. The method 1500 begins with step S1502, where the single sensor 1402 is translated across the length 127 of the faceplate 133 a first time while measuring a distance d between the single sensor 1402 and the faceplate 133, the single sensor 402 being oriented such that a longitudinal axis 1410 of the single sensor 1402 extends at an acute angle 1414 relative to the longitudinal axis 141 of the faceplate 133. In this embodiment, step S1502 may further include first aligning the horizontal line X1 with the longitudinal axis 141 of the faceplate 133 in the same manner described above with respect to the first example embodiment. FIG. 18 shows such an example where the single sensor 1402 has been properly positioned in the X and Y dimensions such that the horizontal axis X1 overlaps with the longitudinal axis 141 of the faceplate 133 and such that the single sensor 1402 is are located to the right of the dispenser 122.

After the single sensor 1402 is positioned as described above, performing step S1502 further includes controlling the stage 106 to move the applique 107 along in a first direction 1424a (FIG. 21A) along the X dimension. Because the horizontal line X1 is aligned with the longitudinal axis 141 of the faceplate 133, the movement of the applique 107 along the X dimension in the direction 1424a will translate the single sensor 1402 across the length 127 of the faceplate 133. Furthermore, due to the above-described geometry of the single sensor 1402 relative to the horizontal line X1, the single sensor 1402 is oriented such that the longitudinal axis 1410 of the single sensor 1402 extends at an acute angle 1414 relative to the longitudinal axis 141 of the faceplate 133. During the translating of the single sensor 1402, the sensor is controlled to sense to measure the distance d between the first sensor 402 and the faceplate 133. The single sensor 1402 is located at a distance from the faceplate 133 in the Z dimension in the same manner as discussed above in the first example embodiment. As the single sensor 1402 passes underneath the faceplate 133 in the direction 1424a in the X dimension, the single sensor 1402 measures the distance d between the sensor and the faceplate in the same manner discussed above with respect to the first example embodiment.

Figure 21A:
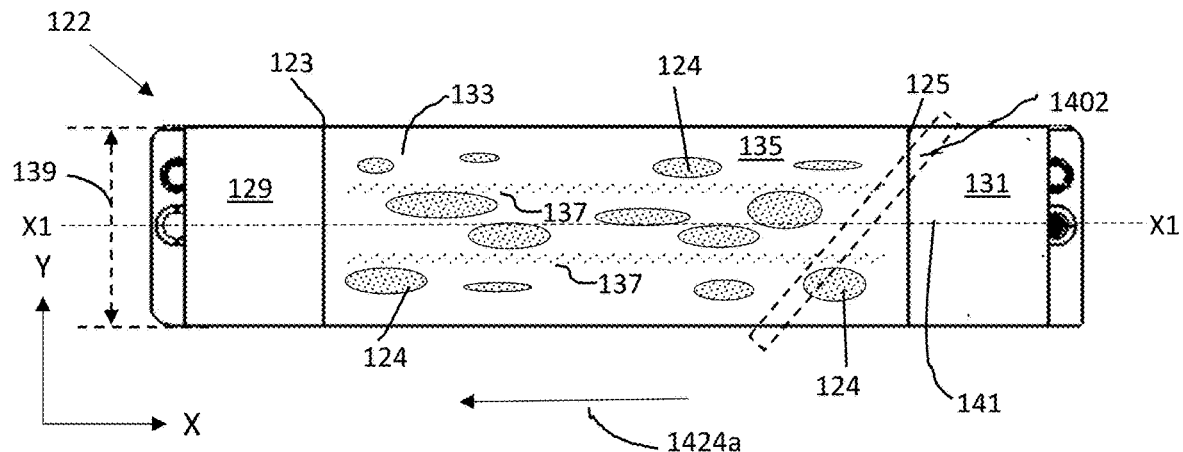
FIG. 21A shows a bottom view of the faceplate with the single sensor superimposed onto the surface of the faceplate as the single sensor travels in the first direction in accordance with the second example embodiment.

FIG. 21A shows a bottom view of the faceplate 133 with the single sensor 1402 superimposed onto the surface 135 of the faceplate 133 as the single sensor 1402 travels in the first direction 1424a. That is, while the single sensor 1402 is at a distance underneath the faceplate 133, the superimposition of the single sensor 1402 onto the faceplate 133 assists in demonstrating the angle of the single sensor 1402 relative to the longitudinal axis 141 of the faceplate 133 during the first pass in the direction 1424a. As seen in FIG. 21A, the horizontal line X1 and the longitudinal axis 141 of the faceplate 133 overlap each other once properly aligned in the manner described above. Thus, once aligned, the angles described above with respect to FIG. 19 are present in FIG. 21B. Accordingly, the single sensor 1402 is angled acutely relative to the longitudinal axis 141 of the faceplate 133.

In summary, step S1502 may be performed by a) controlling the positioning stage to align horizontal line X1 with the longitudinal axis 141 of the faceplate 133, b) controlling the stage to translate the single sensor 1402 across the length 127 of the faceplate along the X dimension in the direction 1424a, c) while measuring the distance between the single sensor 1402 and the faceplate 133.

The method 1500 may then proceed to step S1504, where the single sensor 1402 is translated across the length 127 of the faceplate 133 a second time while measuring a distance d between the single sensor 1402 and the faceplate 133, the single sensor 1402 being oriented such that the longitudinal axis 1410 of the single sensor 1404 extends at an obtuse angle 1416 relative to the longitudinal axis 141 of the faceplate 133. Because there is only a single sensor 1402 in the second example embodiment, step S1504 is different from step S504 of the first example embodiment. In particular, after the step S1502 has been completed and the single sensor 1402 has passed across the length of the faceplate, a sensor rotation stage (not shown) rotates the single sensor 1402 by about 90 degrees. In an alternative embodiment, the sensor rotation stage is the positioning stage 106. That is, the single sensor 1402 should be rotated by an angle 1422, which is the same as angle 422 in the first example embodiment. After this rotation, the single sensor 1402 will be oriented into the same relative position as the second sensor 402 in the first example embodiment. In other words, after rotating the single sensor 1402 by the angle 1422, the single sensor 1402 will now be angled obtusely relative to the horizontal line X1 in the same manner as discussed above with respect to the second sensor 402 in the first example embodiment. As noted above, FIG. 19 includes a representation of the single sensor 1402 after it has been rotated by angle 1422. As shown in FIG. 19, the rotated single sensor 1402 shown in dashed line forms an obtuse angle 1416 relative to the horizontal line X1 that is the same as angle 416 in the first example embodiment and an angle 1420 relative to the horizontal line X1 that is the same as angle 420 in the first example embodiment.

After the single sensor 1402 has been rotated to the position shown in FIG. 19 in dashed line, performing step S1504 further includes controlling the stage 106 to move the applique 107 along in a second direction 1424b (FIG. 21B) along the X dimension, where the second direction 1424b is opposite the first direction 1424a. Because the horizontal line X1 is aligned with the longitudinal axis 141 of the faceplate 133, the movement of the applique 107 along the X dimension in the second direction 1424b will translate the single sensor 1402 across the length 127 of the faceplate 133. Furthermore, due to the above-described geometry of the single sensor 1402 relative to the horizontal line X1 after being rotated, the single sensor 1402 is oriented such that the longitudinal axis 1410 of the single sensor 1402 extends at an obtuse angle 1416 relative to the longitudinal axis 141 of the faceplate 133. During the second translating of the single sensor 1402, the sensor is controlled to sense to measure the distance d between the first sensor 402 and the faceplate 133. The single sensor 1402 is located at a distance from the faceplate 133 in the Z dimension in the same manner as discussed above. As the single sensor 1402 passes underneath the faceplate 133 in the direction 1424b in the X dimension, the single sensor 1402 measures the distance d between the sensor and the faceplate.

Figure 21B:
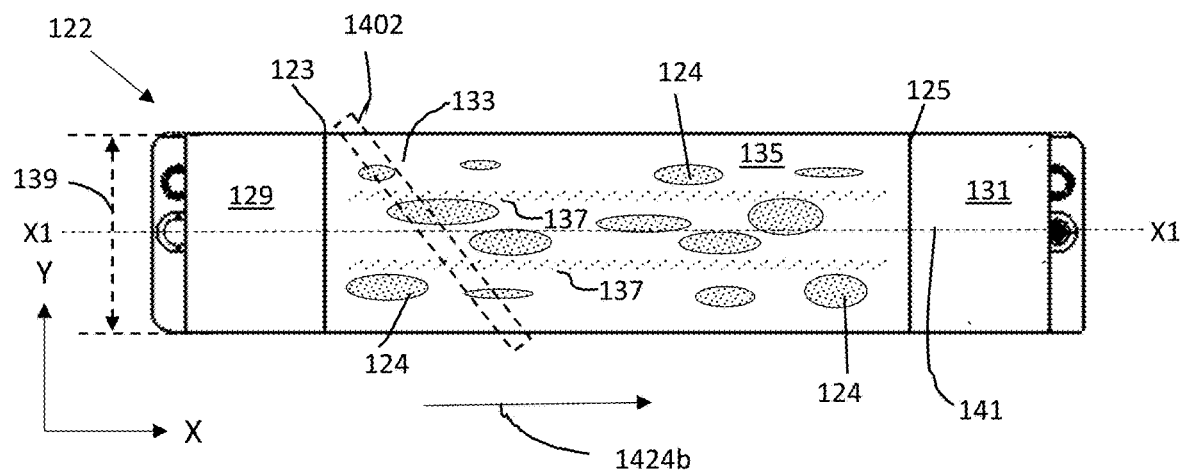
FIG. 21B shows a bottom view of the faceplate with the single sensor superimposed onto the surface of the faceplate, after the single sensor has been rotated, as the single sensor travels in the second direction, in accordance with the second example embodiment.

FIG. 21B shows a bottom view of the faceplate 133 with the single sensor 1402 superimposed onto the surface 135 of the faceplate 133, after the single sensor 1402 has been rotated, as the single sensor 1402 travels in the second direction 1424b. That is, after being rotated, while the single sensor 1402 is at a distance underneath the faceplate 133, the superimposition of the single sensor 1402 onto the faceplate 133 assists in demonstrating the angle of the single sensor 1402 relative to the longitudinal axis 141 of the faceplate 133 during the first pass in the direction 1424b. As seen in FIG. 21A, the horizontal line X1 and the longitudinal axis 141 of the faceplate 133 overlap each other once properly aligned in the manner described above. Thus, once aligned, the angles described above with respect to the rotated sensor shown in dashed line in FIG. 19 are present in FIG. 21B. Accordingly, the single sensor 1402 is angled obtusely relative to the longitudinal axis 141 of the faceplate 133 during the second translating of the single sensor 1402.

The geometry of FIGS. 19, 21A, and 21B can also be described as the longitudinal axis 1410 of the single sensor 1402 during the first translating across the faceplate 133 in the first direction, the longitudinal axis 1410 of the single sensor 1402 during the second translating across the faceplate in the second direction, and the longitudinal axis 141 of the faceplate 133 (or the horizontal line X1), when superimposed and projected onto a horizontal plane (or the surface 135 of the faceplate 133), intersect to form a triangle having two acute angles 1414, 1420. More particularly, the triangle would have the same angles 1414, 1420, and 1422 as described above.

While the example embodiment shown in FIGS. 18 to 21B requires relatively few motions to pass the sensor across the length of the faceplate, rotate, and then pass the sensor across the length of the faceplate again, other embodiments are possible where the single sensor 1402 is not oriented in the manner described above. Rather, the single sensor 1402 can be arbitrarily placed anywhere on the applique 107, including any location and any angle relative to the horizontal line. However, in such embodiments, there will need to be more complex controlling of the stage so that the single sensor 1402 ultimately passes across the faceplate in the geometry shown in FIG. 19. For example, if the single sensor is far away from the faceplate and not preemptively angled acutely relative to a horizontal line that is parallel to the longitudinal axis of the faceplate, step S1502 would include using the stage to move the applique until the single sensor is located at the correct X and Y position, and then further rotating the applique until the single sensor is angled relative to the longitudinal axis 141 of the faceplate 133 in the manner shown in FIG. 19. Then, the same steps noted above of rotating the single sensor and passing the single sensor across the faceplate a second time would be performed. Additionally, while the above description shows the single sensor passing right to left at an acute angle (FIG. 21A) and then passing left to right at an obtuse angle (FIG. 21B), any direction of travel is possible and the angle order can be reversed. That is, while the illustrated second example embodiment starts with the single sensor 1402 having the orientation same as the first sensor 402, in another embodiment the single sensor 1402 may start with an orientation that is the same as second sensor 404 for the first pass and then be rotated to the orientation that is the same as the first sensor 402 for the second pass (i.e., the reverse of what is illustrated in the second example embodiment). It is also possible for the single sensor to travel across the faceplate in the same direction for each passing, but doing so would necessitate more movement of the applique 107 because the single sensor would need to be brought back to the original position to pass in the same direction twice. By traveling in the opposite direction, less movement is required and thus less time.

The data collected during steps S1502 and S1504 is the same as discussed above in the first example embodiment. That is, from the perspective of collecting the data, there is no difference between the first example embodiment and the second example embodiment. During each translating of each of the single sensor across the length of the faceplate, the sensor will continuously measure and report distance data in the same manner described above. The resulting data is the same as shown in FIGS. 11 and 12 discussed above.

After collecting the distance data d from the single sensor 1402 after two passes over the faceplate, the method may proceed to step S1506, where it is determined, based on the data collected in steps S1502, S1504, and predetermined baseline data, whether an amount of accumulated formable material on the surface of the faceplate is greater than a predetermined value. The predetermined baseline data is the same data as discussed above. The manner of collecting the baseline date can be acquired in the same manner as in the first example embodiment or it can be collected in the same manner as discussed above with respect step S1502 and step S1504. Preferably, if the second example embodiment is being implemented, then the baseline data should be acquired using the single sensor 1402. In that case, as disused with the first example embodiment, step S1502 and step S1504 would be performed on a clean faceplate. The acquired baseline data would be the same as shown in FIG. 13 and FIG. 14 in the first example embodiment, where FIG. 13 would correspond to the single sensor being angled acutely during the first translating and FIG. 14 would correspond to the single sensor being angled obtusely during the second translating (or vice versa).

As stated above, step S1506 includes determining, based on the data collected in steps S1502, S1504, and predetermined baseline data, whether an amount of accumulated formable material on the surface of the faceplate is greater than a predetermined value. As in the first example embodiment, this step may include subtracting the data collected in steps S1502, S1504 from the baseline data in the same manner. The data shown in FIG. 15 and FIG. 16 of the first example embodiment would be the same in the second example embodiment, where FIG. 15 would correspond to the single sensor being angled acutely during the first translating and FIG. 16 would correspond to the single sensor being angled obtusely during the second translating (or vice versa).

As with the first example embodiment, after obtaining the data shown in FIGS. 15 and 16, step S1506 may further include calculating probabilities of where formable material is located on the X-Y plane defined by the surface 135 of the faceplate 133. This is performed in the manner described above. After determining which data points are possibly located on the surface of the faceplate, step S1506 may further include comparing each of these data points to a predetermined threshold value. The predetermined threshold value is the same as discussed above with respect to the first example embodiment. If any of the data points determined to possibly be present on the surface of the faceplate is greater than this value, then the answer is "yes" to step S1506, and the method proceeds to step S1508 where the surface of the faceplate is cleaned. If none of the data points determined to possibly be present on the surface of the faceplate is greater than the predetermined value, then the answer to step S1506 is "no" and the method returns to step S1502 after a predetermined number of further dispenses by the dispenser is performed or after a predetermined amount of time has passed. The predetermined amount of dispenses or predetermined amount of time may be as discussed above with respect to the first example embodiment.

As described above, the nanoimprint lithography system 100 may be regulated, controlled, and/or directed by the one or more processors 140 (controller). This includes all of the method steps described above, including controlling the positioning stage to move the sensor(s) across of the faceplate of the dispenser in the manner described above, and controlling and receiving data from the sensor(s). That is methods 300, 500, 1500 may all be controlled by the one or more processors 140 (controller).

Further modifications and alternative embodiments of various aspects will be apparent to those skilled in the art in view of this description. Accordingly, this description is to be construed as illustrative only. It is to be understood that the forms shown and described herein are to be taken as examples of embodiments. For example, while the illustrated embodiments include an example embodiment with two sensors, the same principle of angled detection may be applied to an embodiment in which three or more sensors are used. The difference in angle between the three or more sensors may depend on the number of sensors. For example, as described above, while two sensors are optimally angled at about 90 degrees relative to each other, in the case of three or more sensors, the angle between adjacent sensors may be smaller, where the more sensors being used the smaller the angle may be between adjacent sensors. For example, if exactly three sensors are implemented, where the third sensor is disposed vertically (i.e., 90 degrees relative to the horizontal line X1) in between the first sensor 402 and the second sensor 404, the angle between adjacent sensors may be 45 degrees. More than three sensors would further divide the angle between adjacent sensors. Furthermore, in other embodiments the three or more sensors may be angled differently relative to each other. For example, if exactly three sensors are implements, where the third sensor is not disposed vertically (i.e., has an angle less than or greater than 90 degrees relative to the horizontal line), then the angle between the first sensor and the third sensor will be different than the angle between the second sensor and the third sensor. Thus, the angle between adjacent sensors can vary depending on how many sensors are present and the angles of each of the sensors relative to the horizontal line X1. Additional sensors at smaller angles will provide more data points to more precisely determine the location of the formable material on the faceplate. The number of sensors used and the angle between adjacent sensors may be optimized for the particular application. For example, the number of sensors may be up to 20, up 15, up to 10, or up to 5 in certain applications. In general, the two sensor embodiment described above provides sufficient data to accurately determine accumulation on the faceplate for most applications. Elements and materials may be substituted for those illustrated and described herein, parts and processes may be reversed, and certain features may be utilized independently, all as would be apparent to one skilled in the art after having the benefit of this description.

What is claimed is:

1. A method of inspecting a dispenser including a faceplate, the faceplate having a first end, a second end, a surface, a length extending from the first end to the second end, and a longitudinal axis along the length, the method comprising:
   translating a sensor across the length of the faceplate while measuring a distance between the sensor and the faceplate, wherein the sensor is oriented such that a longitudinal axis of the sensor extends at an acute angle relative to the longitudinal axis of the faceplate;
   a step selected from the group consisting of:
      a) translating another sensor across the length of the faceplate while measuring a distance between the other sensor and the faceplate, wherein the other sensor is oriented such that a longitudinal axis of the other sensor extends at an obtuse angle relative to the longitudinal axis of the faceplate, and
      b) another translating of the sensor across the length of the faceplate while measuring the distance between the sensor and the faceplate, wherein the sensor is oriented such that the longitudinal axis of the sensor extends at an obtuse angle relative to the longitudinal axis of the faceplate; and
   determining, based on the measured distances, whether an amount of accumulated formable material on the surface of the faceplate is greater than a predetermined value.

2. The method of claim, 1 wherein the sensor and the other sensor are capacitive sensors.

3. The method of claim 1, wherein the sensor and the other sensor each have an aspect ratio of 40:1 to 10:1.

4. The method of claim 1, wherein the sensor and the other sensor each have a length that is equal to or greater than the width of the faceplate.

5. The method of claim 1, wherein the acute angle is from 42° to 48° and the obtuse angle is from 132° to 138°.

6. The method of claim 1, comprising the translating of the other sensor across the length of the faceplate while measuring the distance between the other sensor and the faceplate.

7. The method of claim 6, wherein the sensor and the other sensor are translated across the length of the faceplate together.

8. The method of claim 6, wherein, during the translating of the sensor and the translating of the other sensor, the longitudinal axis of the sensor and the longitudinal axis of the other sensor are angled relative to each other by an angle of 88° to 92°.

9. The method of claim 6, wherein a speed of travel of the sensor and the other sensor is selected such that the sensor and the other sensor are translated across the length of the faceplate within 0.01 to 0.10 seconds.

10. The method of claim 6, wherein during the translating of the sensor and the other sensor, the sensor and the other sensor are oriented such that the longitudinal axis of the first sensor, the longitudinal axis of the second sensor, and the longitudinal axis of the faceplate, when projected onto a horizontal plane, intersect to form a triangle having two acute angles.

11. The method of claim 1, comprising the other translating of the sensor across the length of the faceplate while measuring the distance between the sensor and the faceplate.

12. The method of claim 11, wherein the translating of the sensor and the other translating of the sensor are performed successively.

13. The method of claim 12, wherein the translating of sensor is performed in a first direction and the other translating is performed in a second direction opposite the first direction.

14. The method of claim 11, wherein the sensor has a first orientation during the translating and a second orientation during the other translating such that the longitudinal axis of the sensor in the first orientation and the longitudinal axis of the sensor in the second orientation, when superimposed and projected onto the horizontal plane, intersect to form at an angle of 88° to 92°.

15. The method of claim 11, wherein the sensor has a first orientation during the translating and a second orientation during the other translating such that the longitudinal axis of the sensor in the first orientation, the longitudinal axis of the sensor in the second orientation, and the longitudinal axis of the faceplate, when superimposed and projected onto the horizontal plane, intersect to form a triangle having two acute angles.

16. The method of claim 1, further comprising, prior to translating the sensor across the length of the faceplate and prior to step a) or step b):
   translating the sensor across the length of a faceplate free of formable material while measuring a distance between the sensor and the faceplate free of formable material, wherein the sensor is oriented such that the longitudinal axis of the sensor extends at the acute angle relative to the longitudinal axis of the faceplate free of formable material; and
   a step selected from the group consisting of:
      c) translating the other sensor across the length of the faceplate free of formable material while measuring a distance between the other sensor and the faceplate free of formable material, wherein the other sensor is oriented such that the longitudinal axis of the other sensor extends at the obtuse angle relative to the longitudinal axis of the faceplate free of formable material, and
      d) another translating of the sensor across the length of the faceplate free of formable material while measuring the distance between the sensor and the faceplate free of formable material, wherein the sensor is oriented such that the longitudinal axis of the sensor extends at the obtuse angle relative to the longitudinal axis of the faceplate free of formable material,
   wherein the determining of whether the amount of accumulated formable material on the surface of the faceplate is greater than a predetermined value is further based on the distances measured for the faceplate free of formable material.

17. The method of claim 1, wherein the sensor and the other sensor are located on a surface of an applique facing the faceplate.

18. The method of claim 17, wherein the translating of the sensor, the translating of the other sensor, and the other translating of the sensor comprise moving the applique.

19. The method of claim 1, further comprising, in a case that the amount of accumulated formable material is determined to be greater than a predetermined value, cleaning the surface of the faceplate.

20. A system for inspecting a dispenser including a faceplate, the faceplate having:
   a first end;
   a second end;
   a surface;
   a length extending from the first end to the second end; and a longitudinal axis along the length,
the system comprising:
- at least one sensor;
- one or more processors; and
- one or more memories storing instructions, when executed by the one or more processors, for:
  - translating a sensor of the at least one sensor across the length of the faceplate while measuring a distance between the sensor and the faceplate, wherein the sensor is oriented such that a longitudinal axis of the sensor extends at an acute angle relative to the longitudinal axis of the faceplate;
  - performing a step selected from the group consisting of:
    - a) translating another sensor of the at least one sensor across the length of the faceplate while measuring a distance between the other sensor and the faceplate, wherein the other sensor is oriented such that a longitudinal axis of the other sensor extends at an obtuse angle relative to the longitudinal axis of the faceplate, and
    - b) another translating of the sensor across the length of the faceplate while measuring the distance between the sensor and the faceplate, wherein the sensor is oriented such that the longitudinal axis of the sensor extends at an obtuse angle relative to the longitudinal axis of the faceplate; and
  - determining, based on the measured distances, whether an amount of accumulated formable material on the surface of the faceplate is greater than a predetermined value.

21. A method of making an article, comprising:
cleaning a dispenser including a faceplate, the faceplate having a first end, a second end, a surface, a length extending from the first end to the second end, and a longitudinal axis along the length, the cleaning including:
- translating a sensor across the length of the faceplate while measuring a distance between the sensor and the faceplate, wherein the sensor is oriented such that a longitudinal axis of the sensor extends at an acute angle relative to the longitudinal axis of the faceplate;
- a step selected from the group consisting of:
  - a) translating another sensor across the length of the faceplate while measuring a distance between the other sensor and the faceplate, wherein the other sensor is oriented such that a longitudinal axis of the other sensor extends at an obtuse angle relative to the longitudinal axis of the faceplate, and
  - b) another translating of the sensor across the length of the faceplate while measuring the distance between the sensor and the faceplate, wherein the sensor is oriented such that the longitudinal axis of the sensor extends at an obtuse angle relative to the longitudinal axis of the faceplate;
- determining, based on the measured distances, whether an amount of accumulated formable material on the surface of the faceplate is greater than a predetermined value; and
- in a case that the amount of accumulated formable material is determined to be greater than a predetermined value, cleaning the surface of the faceplate;

dispensing a portion of the formable material onto a substrate using the dispenser;
forming a pattern or a layer of the dispensed formable material on the substrate; and
processing the formed pattern or layer to make the article.

* * * * *